US007592247B2

(12) United States Patent
Yang et al.

(10) Patent No.: US 7,592,247 B2
(45) Date of Patent: Sep. 22, 2009

(54) SUB-LITHOGRAPHIC LOCAL INTERCONNECTS, AND METHODS FOR FORMING SAME

(75) Inventors: Haining Yang, Wappingers Falls, NY (US); Jack A. Mandelman, Flat Rock, NC (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 356 days.

(21) Appl. No.: 11/538,550

(22) Filed: Oct. 4, 2006

(65) Prior Publication Data
US 2008/0083991 A1     Apr. 10, 2008

(51) Int. Cl.
*H01L 21/4763* (2006.01)

(52) U.S. Cl. .................. 438/618; 438/637; 438/672; 257/758

(58) Field of Classification Search ......... 438/618–624, 438/637–638, 672–673; 257/758, 760
See application file for complete search history.

(56) References Cited

U.S. PATENT DOCUMENTS

| | | | |
|---|---|---|---|
| 6,630,288 B2 * | 10/2003 | Shields et al. ............... | 430/313 |
| 7,405,147 B2 | 7/2008 | Edelstein et al. | |
| 2004/0012040 A1 | 1/2004 | Osada et al. | |

2004/0113137 A1    6/2004   Lowrey

OTHER PUBLICATIONS

Paul F. Nealey et al., Self-Assembling Resists for Nanolithography, IEEE, 2005.
Chinese Patent Application Publication No. CN1649107 dated Aug. 3, 2005 English-language abstract only.
Chinese Patent Application Publication No. CN1506972 dated Jun. 23, 2004 English-language abstract only.

* cited by examiner

*Primary Examiner*—Thinh T Nguyen
(74) *Attorney, Agent, or Firm*—Scully, Scott, Murphy & Presser, P.C.; H. Daniel Schnurmann

(57) ABSTRACT

The present invention relates to a semiconductor device having first and second active device regions that are located in a semiconductor substrate and are isolated from each other by an isolation region therebetween, while the semiconductor device contains a first sub-lithographic interconnect structure having a width ranging from about 20 nm to about 40 nm for connecting the first active device region with the second active device region. The semiconductor device preferably contains at least one static random access memory (SRAM) cell located in the semiconductor substrate, and the first sub-lithographic interconnect structure directly cross-connects a pull-down transistor of the SRAM cell with a pull-up transistor thereof without any metal contact therebetween. The first sub-lithographic interconnect structure can be readily formed by lithographic patterning of a mask layer, followed by formation of sub-lithographic features using either self-assembling block copolymers or dielectric sidewall spacers.

1 Claim, 23 Drawing Sheets

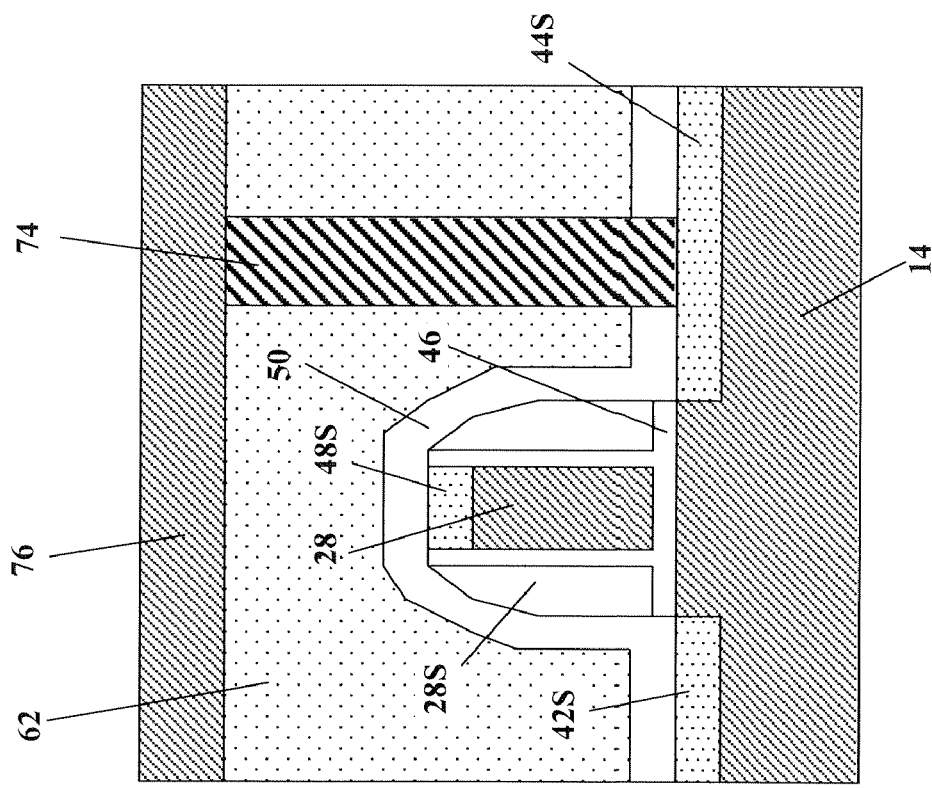
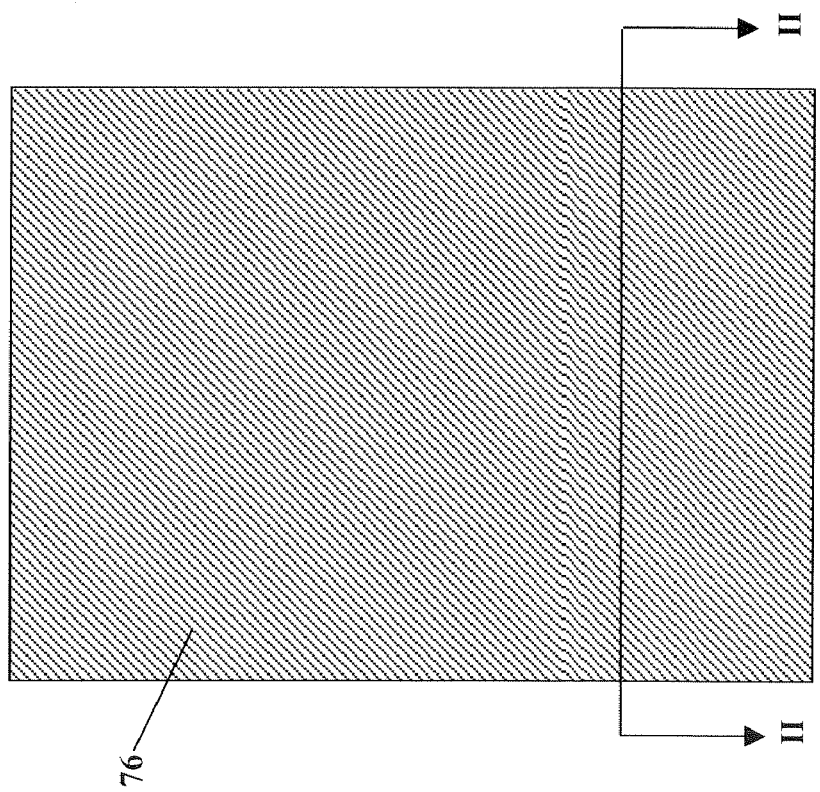
FIG. 15B
FIG. 15A

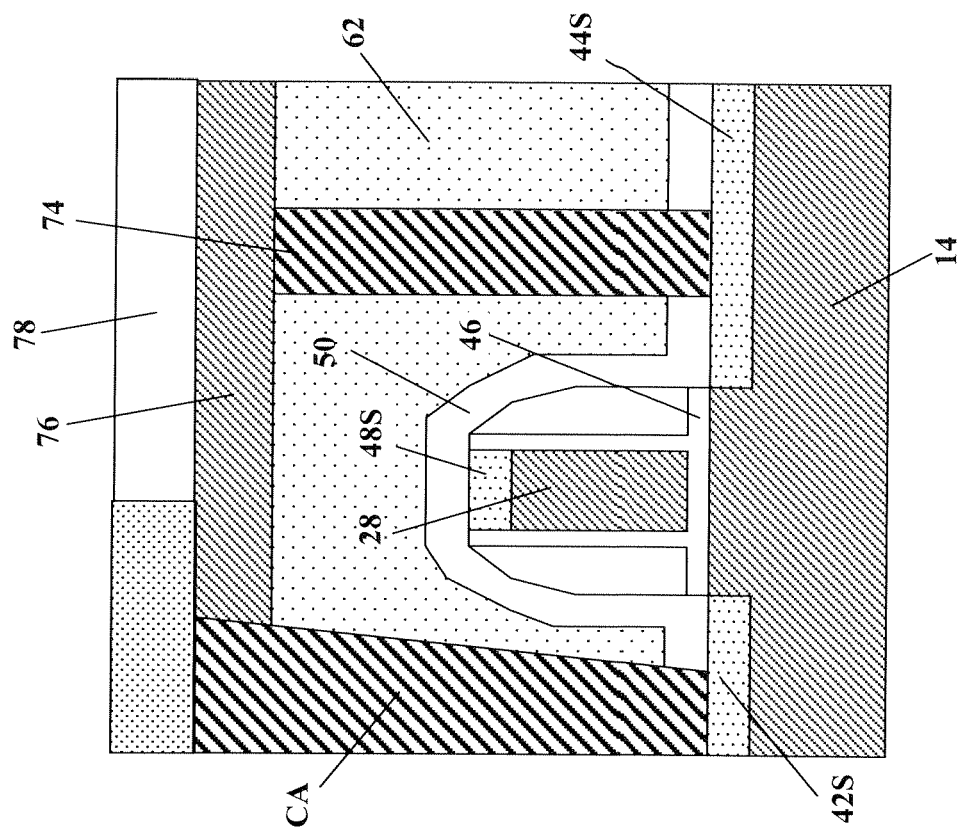
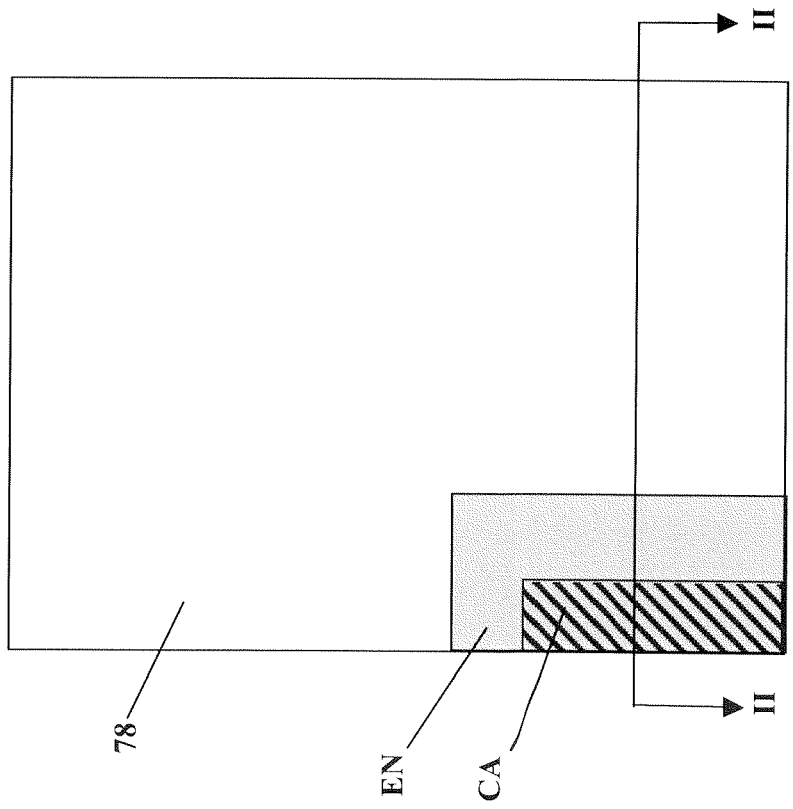
FIG. 17B
FIG. 17A

SUB-LITHOGRAPHIC LOCAL INTERCONNECTS, AND METHODS FOR FORMING SAME

FIELD OF THE INVENTION

This invention relates to semiconductor devices that comprise local conductive interconnects having sub-lithographic widths. More specifically, the present invention relates to sub-45 nm or sub-32 nm static random access memory (SRAM) cells with local conductive interconnects having sub-lithographic widths, as well as methods for fabricating such SRAM cells.

BACKGROUND OF THE INVENTION

A static random access memory (SRAM) is a significant memory device due to its high speed, low power consumption, and simple operation. Unlike a dynamic random access memory (DRAM) cell, the SRAM does not need to regularly refresh the stored data and it has a straightforward design.

Each bit in a typical six-transistor SRAM (6T-SRAM) cell is stored on four transistors, generally referred to as load transistors (or pull-up transistors) and driver transistors (or pull-down transistors), that form a flip-flop circuit containing two cross-coupled inverters. This storage cell has two stable states which are used to denote 0 and 1. Two additional access transistors (or pass-gate transistors) serve to control the access to a storage cell during read and write operations.

FIG. 1A shows a top-down view of an exemplary complementary metal-oxide-semiconductor (CMOS) 6T-SRAM cell underneath the first metal interconnect level (M1). The 6T-SRAM cell contains: (1) four active device regions (i.e., doped-well regions) 112, 114, 116, and 118, and (2) four gate structures 122, 124, 126, and 128, which form 6 typical metal-oxide-semiconductor (MOS) transistors 101-106. Specifically, n-channel pass-gate transistors 101 and 104 and n-channel pull-down transistors 102 and 103 are formed within the n-type active device regions 112 and 114, and p-channel pull-up transistors 105 and 106 are formed within the p-type active device regions 116 and 118. The active device regions 112, 114, 116, and 118 are formed within the same semiconductor substrate, which may preferably be a silicon substrate doped with n-type and p-type impurities in the vicinity of the p-channel transistors and the n-channel transistors, respectively. Gate structures 122 and 126 extend above the active device region 112 to form gates for the pull-down transistor 102 and the pass-gate transistor 101, respectively. Similarly, gate structures 124 and 128 extend above the active device region 114 to form gates for the pull-down transistor 103 and the pass-gate transistor 104, respectively. Further, the gate structures 122 and 124 extend to over the active device regions 116 and 118 to form gates for the pull-up transistors 105 and 106, respectively. Each SRAM cell further contains multiple metal contacts (CAs) for accessing the respective components of the transistors 101-106, as shown in FIG. 1A.

FIG. 1B shows a top-down view of the exemplary the SRAM cell of FIG. 1A at the M1 level, i.e., the first metal interconnect level. The SRAM cell at the M1 level contains multiple external interconnects or nodes (ENs) and internal interconnects or nodes (INs), each of which overlays one or more SRAM metal contacts (CAs) and forms electrical connections with the CAs. For example, the two ENs located at the middle left and right borders of the SRAM cell, respectively, overlay and form electrical connections with the CAs that overlay the gate structures 126 and 128 of the pass-gate transistors 101 and 104. The six ENs located at the upper and lower borders of the SRAM cell, respectively, overlay and form electrical connections with the CAs that overlay the source or drain regions of the transistors 101-106. The two INs located in the middle of the SRAM cell, respectively, cross-connect the pull-down transistors 102 and 103 with the pull-up transistors 105 and 106.

FIG. 1C shows a cross-sectional view of the SRAM cell along line I-I in FIG. 1B. The two ENs, which are located at the M1 level along the middle left and right borders of the SRAM cell, electrically connect the underlying CAs (not shown) at the contact level with metal vias 132 in the first via level (V1), which in turn are electrically connected to metal interconnects (not shown) in upper metal levels (not shown), such as M2, M3, . . . etc., and/or metal vias (not shown) in upper via levels (not shown), such as V2, V3, . . . etc. Each of the two INs, which are located in the M1 level at the middle portions of the SRAM cell, electrically connects one CA with another CA at the contact level. In this manner, the INs cross-connects the pull-down transistors 102 and 103 located at the active device regions 112 and 114 with the respective pull-up transistors 105 and 106 located at the active device regions 116 and 118 in the underlying substrate 110. Note that the surfaces of the active device regions 112, 114, 116 and 118 are silicided, thereby forming respective surface metal silicide layers 112S, 114S, 116S and 118S. The INs extend only along the M1 level and are not connected to any metal vias and/or interconnects in the upper via and/or metal levels. Therefore, the INs are also referred to hereinafter as "local interconnects," which hereinabove refer to interconnects that are present only at the M1 level and/or the underlying contact level but not at any other via and/or metal level above the M1 level.

As the 45 nm node and the 32 nm node generations of complementary metal-oxide-semiconductor (CMOS) devices are approached, scaling of the SRAM cells becomes imperative. However, the scaling effort is significantly limited by conventional lithographic printing, which has been used for patterning the metal contacts and the metal interconnects of the SRAM cells. Due to the large number of metal contacts at the CA level and metal interconnects at the M1 level of the SRAM cells, the overlay limits of conventional lithographic printing have already been reached, and it is difficult to scale the SRAM cells to fit the space requirements of the 45 nm node and the 32 nm node generations.

Therefore, there is a need to reduce the size and number of metal contacts and metal interconnects in the SRAM cells, thus allowing further scaling of the SRAM cells for the 45 nm node and the 32 nm node generations.

SUMMARY OF THE INVENTION

The present invention solves the above-described problems by providing improved SRAM structures, each of which contains two sub-lithographic interconnects that replace the four metal contacts at the contact level and the two local interconnects at the M1 level for directly connecting the pull-down and pull-up transistors, without any metal contact therebetween. In this manner, the number of metal contacts and metal interconnects in each SRAM cell is significantly reduced, and further scaling of the SRAM layout can be achieved.

In one aspect, the present invention relates to a semiconductor device containing first and second active device regions that are located in a semiconductor substrate and are isolated from each other by an isolation region therebetween, wherein the semiconductor device includes a first sub-lithographic interconnect structure having a width ranging from about 20 nm to about 40 nm, and wherein the first sub-lithographic interconnect structure connects the first active device region with the second active device region.

The first sub-lithographic interconnect structure may comprises any suitable conductive materials, such as doped polysilicon, W, Cu, SiGe, NiSi, TaN, and mixtures thereof. Preferably, but not necessarily, the first sub-lithographic interconnect structure is L-shaped. The first sub-lithographic interconnect structure can directly connect the first and second active device regions, without any metal contact therebetween.

The semiconductor device structure as described hereinabove may further contain additional device regions that are located in the semiconductor substrate and are isolated from each other by additional isolation region(s) therebetween, wherein the semiconductor device further includes additional sub-lithographic interconnect structure(s) for connecting the additional active device regions with one another.

In another aspect, the present invention relates to a semiconductor device containing at least one static random access memory (SRAM) cell located in a semiconductor substrate, wherein the SRAM cell has a first sub-lithographic interconnect structure that has a width ranging from about 20 nm to about 40 nm and cross-connects a first pull-down transistor of the SRAM cell with a first pull-up transistor thereof.

Preferably, the first sub-lithographic interconnect structure directly cross-connects the first pull-down transistor and the first pull-up transistor of the SRAM cell, without any metal contact therebetween.

The SRAM cell, as described hereinabove, may further comprise a second pull-down transistor, a second pull-up transistor, and a second sub-lithographic interconnect structures that respectively cross-connect the second pull-down transistor with the second pull-up transistor. A contact level and a first metal interconnect level can be provided over the semiconductor substrate, while the first metal interconnect level, unlike the M1 level in the prior art SRAM cell illustrated hereinabove, does not contact any local interconnect for cross-connecting the first or second pull-down transistor with the first or second pull-up transistor of the SRAM cell.

In a further aspect, the present invention relates to a method for forming a semiconductor device, comprising:
  forming first and second active device regions in a semiconductor substrate, wherein the first and second active device regions are isolated from each other by an isolation region therebetween; and
  forming a first sub-lithographic interconnect structure that has a width ranging from about 20 nm to about 40 nm for connecting the first and second active device regions.

In a first specific embodiment of the present invention, the first sub-lithographic interconnect structure is formed by:
  forming an inter-level dielectric (ILD) layer over the first and second active device regions;
  forming a lithographically patterned mask layer over the ILD layer, wherein the lithographically patterned mask layer defines a first lithographic mask opening having a width ranging from about 20 nm to about 120 nm;
  applying a layer of a block copolymer over the lithographically patterned mask layer, wherein the block copolymer comprises at least first and second polymeric block components that are immiscible with each other;
  annealing the block copolymer layer to form a single unit polymer block having a sub-lithographic width ranging from about 20 nm to about 40 nm inside the first lithographic mask opening, wherein the single unit polymer block comprises the second polymeric block component and is embedded in a polymeric matrix that comprises the first polymeric block component;
  selectively removing the second polymeric block component relative to the first polymeric block component to form a first sub-lithographic opening having a width ranging from about 20 nm to about 120 nm in the polymeric matrix inside the first lithographic mask opening; and
  patterning the ILD layer using the first sub-lithographic opening and filling the first sub-lithographic opening with a conductive material.

Preferably, the first lithographic mask opening as mentioned hereinabove has a width ranging from about 60 nm to about 100 nm.

The block copolymer as mentioned hereinabove preferably comprises the first and second polymeric block components at a weight ratio of from about 60:40 to about 40:60, and the single unit polymer block preferably comprises a lamella that stands perpendicular to an upper surface of the ILD layer. The block copolymers are preferably A-B block copolymers that are readily selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). In a particularly preferred, but not necessary, embodiment of the present invention, the block copolymer comprises PS-b-PMMA having a PS:PMMA weight ratio ranging from about 60:40 to about 40:60.

In a second, alternative embodiment of the present invention, the first sub-lithographic interconnect structure is formed by:
  forming an inter-level dielectric (ILD) layer over the first and second active device regions;
  forming a lithographically patterned mask layer over the ILD layer, wherein the lithographically patterned mask layer defines a first lithographic mask opening having a width ranging from about 20 nm to about 120 nm;
  forming dielectric sidewalls spacers in the first lithographic mask opening to define a first sub-lithographic opening having a width ranging from about 20 nm to about 40 nm; and
  patterning the ILD layer using the first sub-lithographic opening and filling the first sub-lithographic opening with a conductive material.

Other aspects, features and advantages of the invention will be more fully apparent from the ensuing disclosure and appended claims.

BRIEF DESCRIPTION OF THE DRAWINGS

FIGS. 3-17B are top or cross-sectional views that illustrate exemplary processing steps for forming an improved SRAM cell with L-shaped sub-lithographic local interconnects using a self-assembling block copolymer, according to one embodiment of the present invention.

DETAILED DESCRIPTION OF THE INVENTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As mentioned hereinabove, the present invention provides an improved SRAM cell structure that comprises two sub-lithographic local interconnects that directly cross-connect the pull-down and pull-up transistors in the SRAM cell without any metal contacts therebetween. The use of such sub-lithographic local interconnects eliminates four metal contacts at the contact level and two local interconnects at the M1 level, thereby significantly reducing the total number of metal contacts and metal interconnects in each SRAM cell. Further, the sub-lithographic sizes of the local interconnects reduce the device density of each SRAM cell and allow further scaling of the SRAM cells.

Figure 1A:
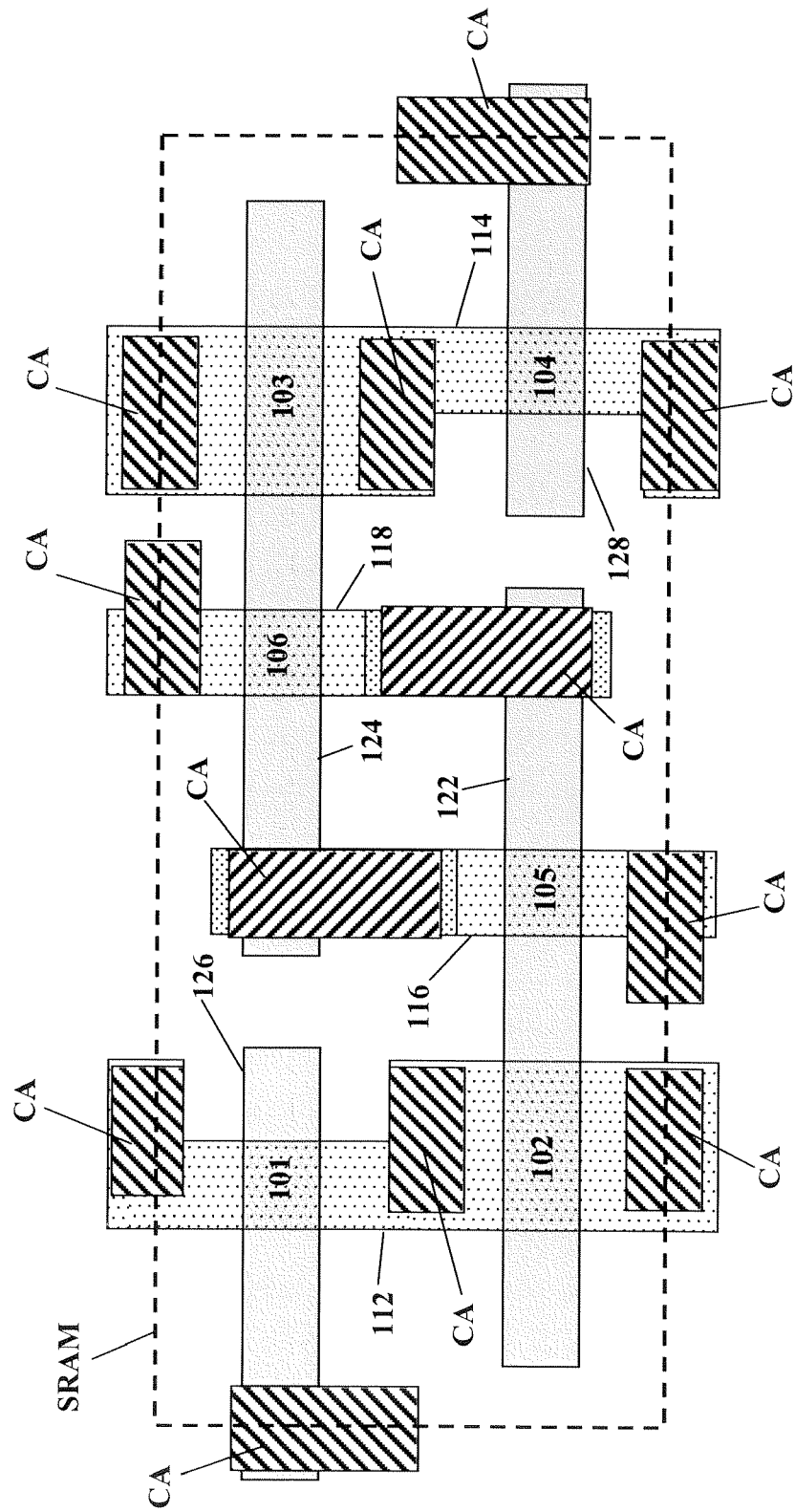
FIG. 1A shows a top view of a conventional 6T-SRAM cell, as viewed from underneath the M1 level.
Figure 1B:
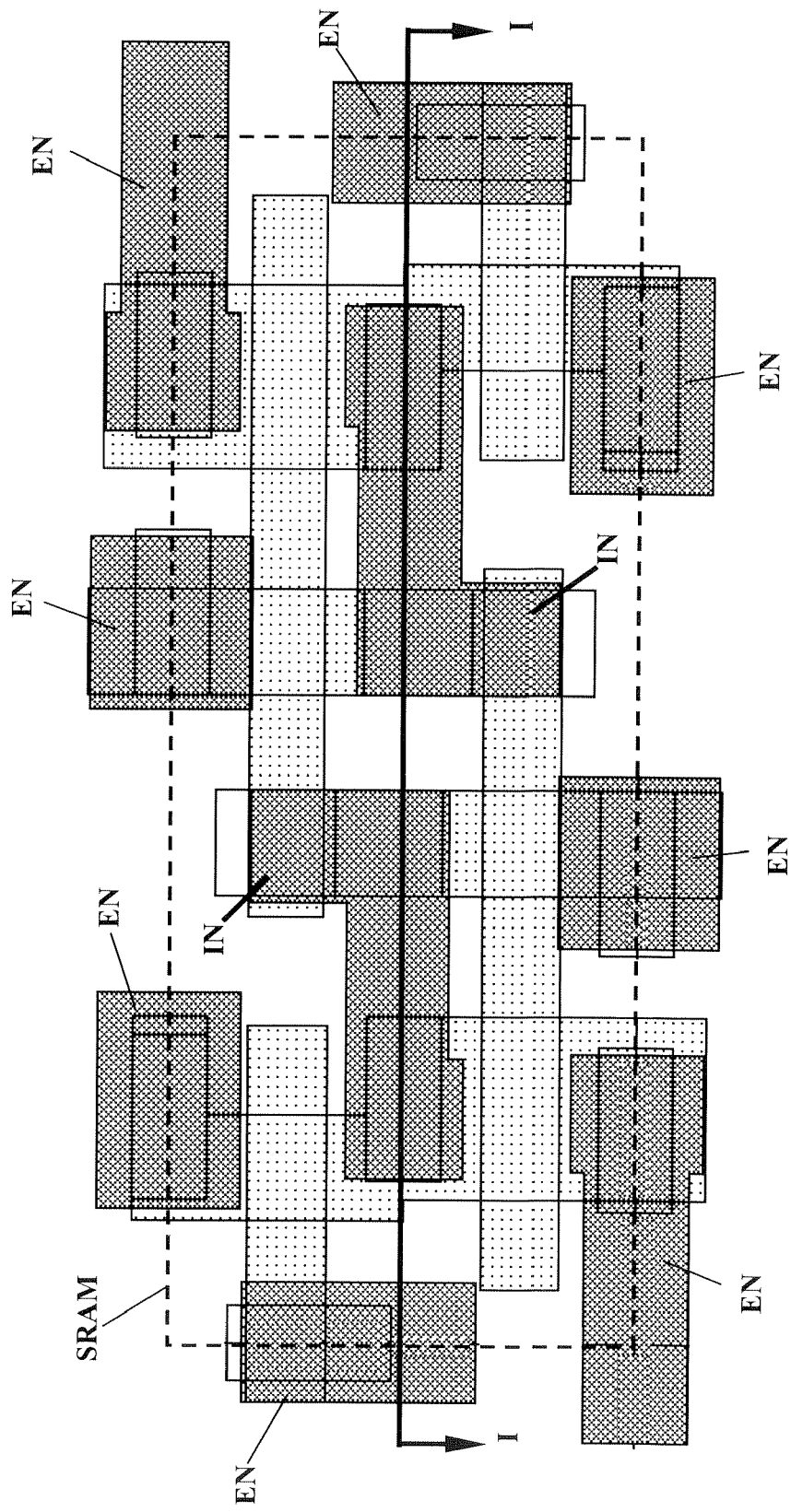
FIG. 1B shows a top view of the conventional 6T-SRAM cell of FIG. 1B at the M1 level.
Figure 1C:
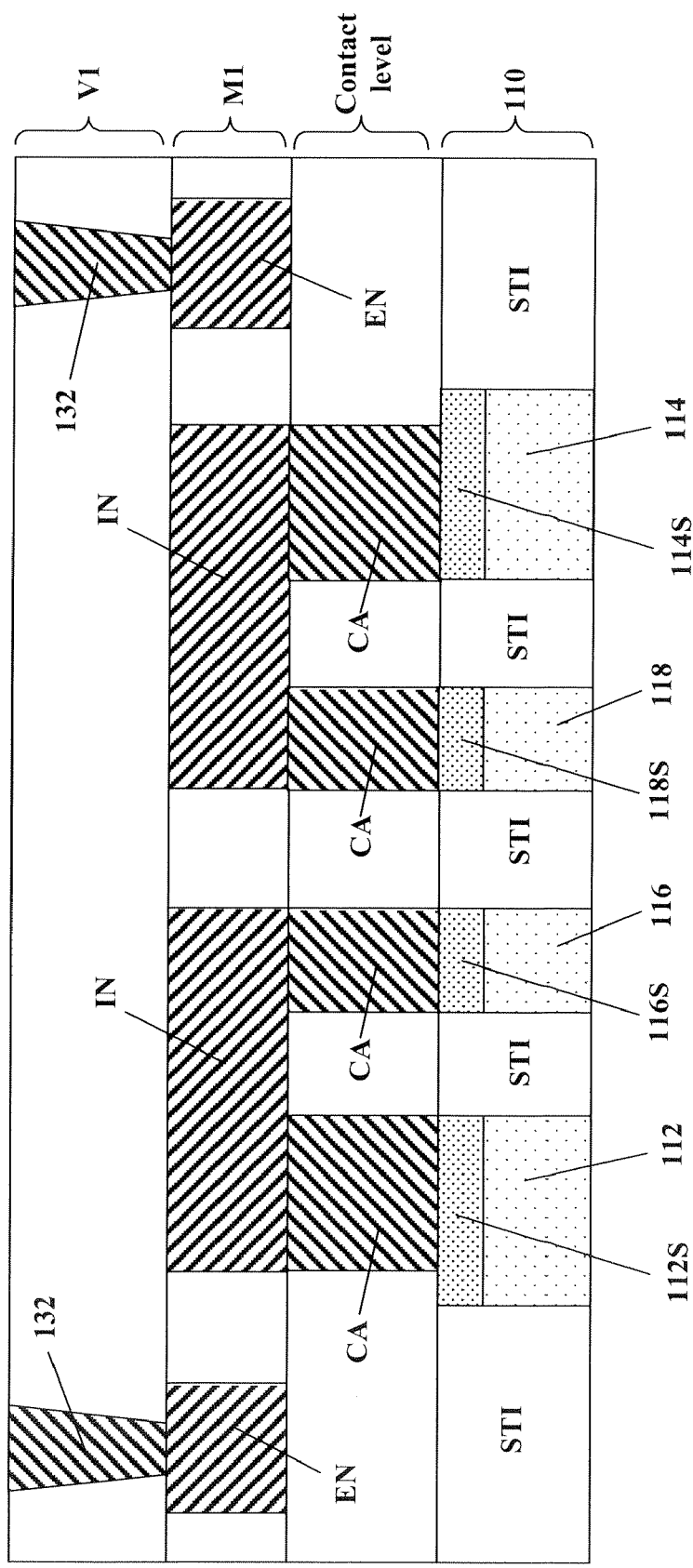
FIG. 1C shows a cross-sectional view of the convention 6T-SRAM cell of FIGS. 1A-1B through the line I-I in FIG. 1B.
Figure 2:
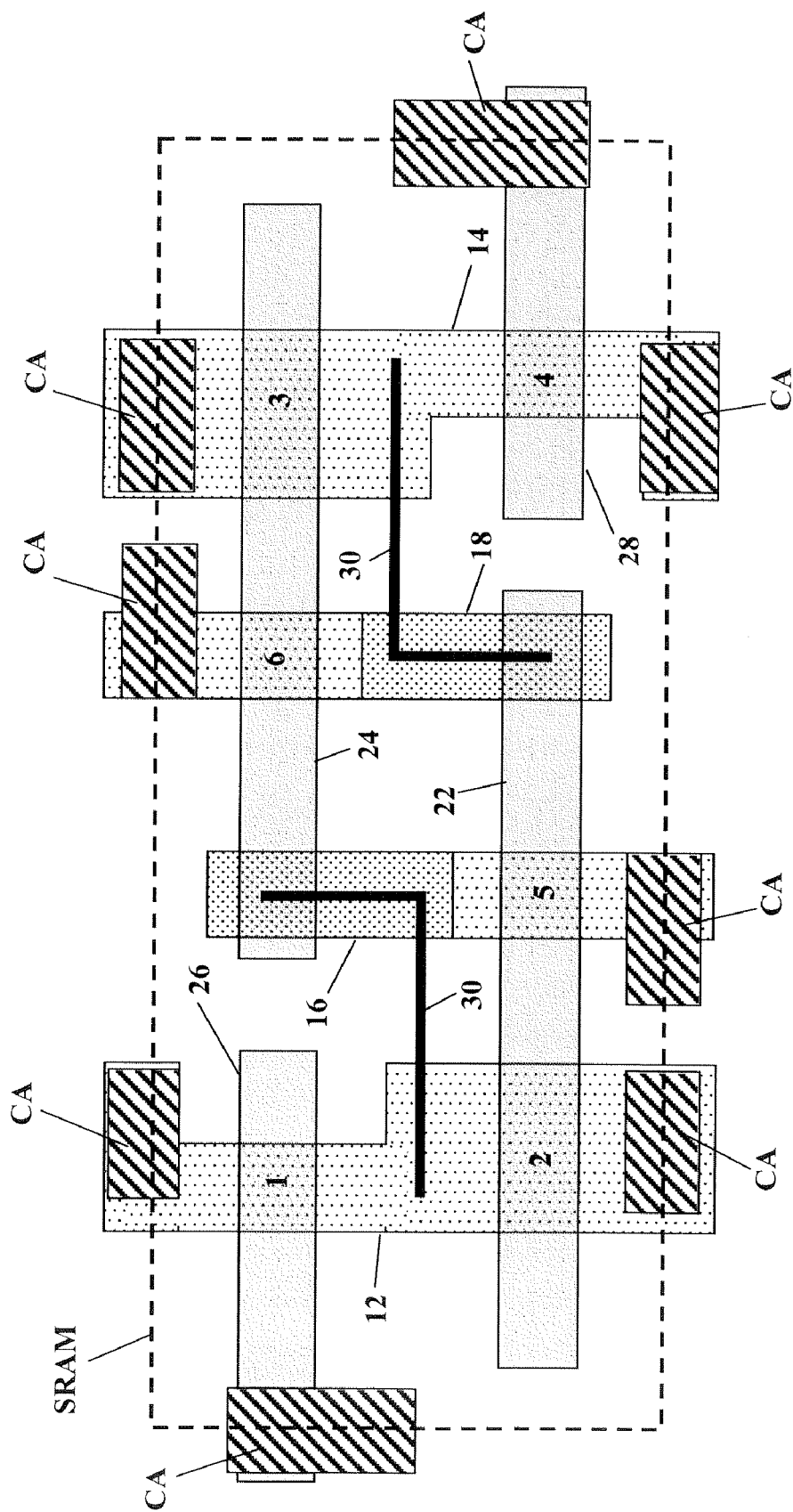
FIG. 2 shows a top view of a 6T-SRAM cell with L-shaped sub-lithographic local interconnects underneath the M1 level, according to one embodiment of the present invention.

FIG. 2 shows a top view of a 6T-SRAM cell underneath the first metal interconnect level (M1). The 6T-SRAM cell contains: (1) four active device regions (i.e., doped-well regions) 12, 14, 16, and 18, and (2) four gate structures 22, 24, 26, and 28, which form 6 typical metal-oxide-semiconductor (MOS) transistors 1-6. Specifically, n-channel pass-gate transistors 1 and 4 and n-channel pull-down transistors 2 and 3 are formed within the n-type active device regions 12 and 14, and p-channel pull-up transistors 5 and 6 are formed within the p-type active device regions 16 and 18. The active device regions 12, 14, 16, and 18 are formed within the same semiconductor substrate, which may preferably be a silicon substrate doped with n-type and p-type impurities in the vicinity of the p-channel transistors and the n-channel transistors, respectively. Gate structures 22 and 26 extend above the active device region 12 to form gates for the pull-down transistor 2 and the pass-gate transistor 1, respectively. Similarly, gate structures 24 and 28 extend above the active device region 14 to form gates for the pull-down transistor 3 and the pass-gate transistor 4, respectively. Further, the gate structures 22 and 24 extend to over the active device regions 16 and 18 to form gates for the pull-up transistors 5 and 6, respectively.

Each SRAM cell further contains two L-shaped sub-lithographic local interconnects 30 having a width ranging from about 20 nm to about 40 nm. The L-shaped sub-lithographic local interconnects 30 function to cross-connect the pull-down transistors 2 and 3 with the pull-up transistors 5 and 6 and the gate structures 24 and 22, respectively. Multiple metal contacts (CAs) are also provided at the peripherals of the SRAM cell for accessing the respective components of the transistors 101-106 in the SRAM cell, as shown in FIG. 2.

The improved SRAM cell structure of FIG. 2 can be readily formed by exemplary processing steps illustrated in FIGS. 3-18B, according to one embodiment of the present invention.

Figure 3:
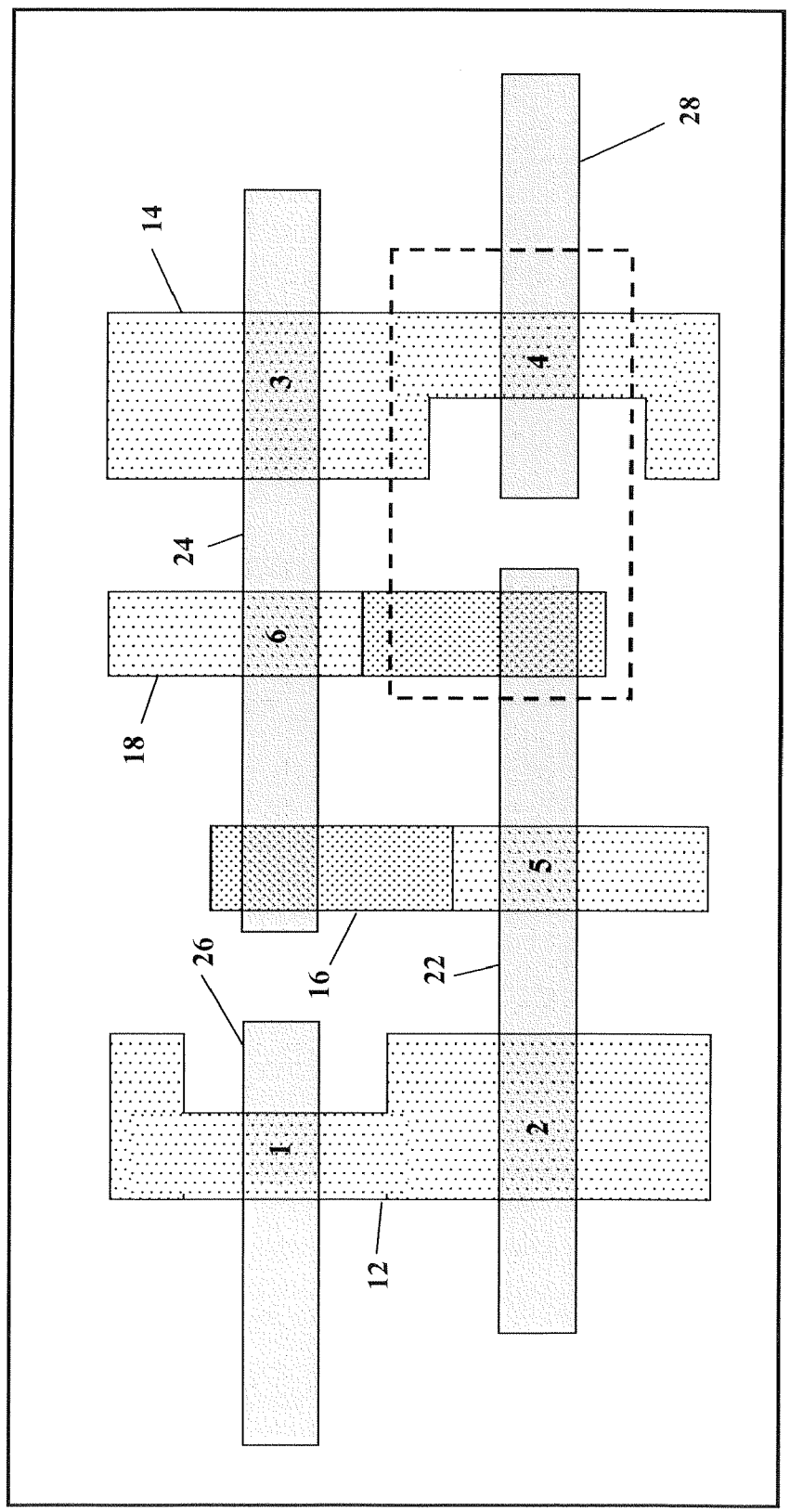

Specifically, a substantially complete SRAM cell structure, which contains all elements shown in FIG. 2 except the two L-shaped sub-lithographic local interconnects 30 and the multiple peripheral metal contacts (CAs), is first provided, as shown in FIG. 3. It is noted that the SRAM cell structure shown in FIG. 2 is fabricating utilizing conventional processing that is well known in the art.

Figure 4B:
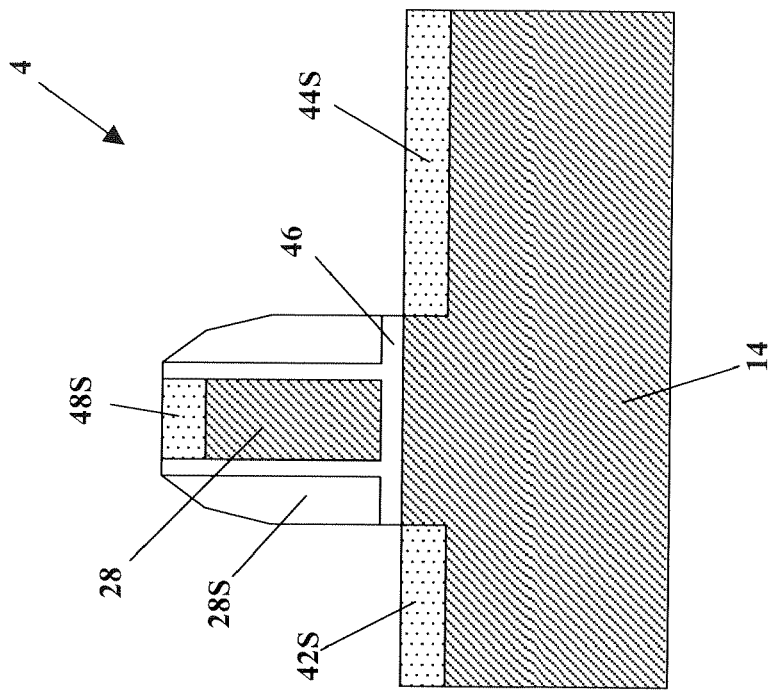
Figure 4A:
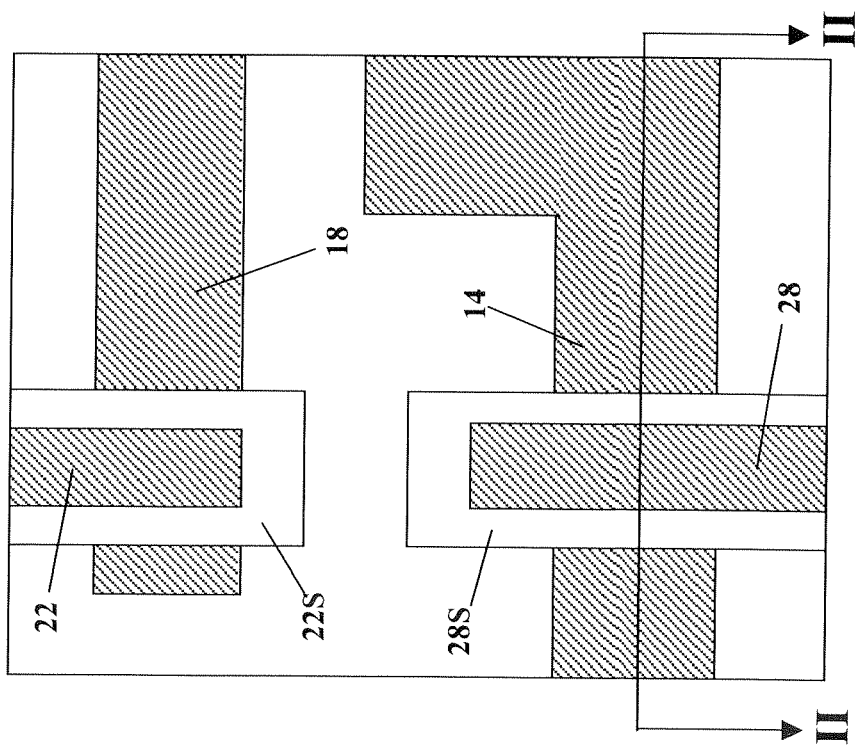

FIG. 4A shows an enlarged top view of a selected portion of the SRAM cell, as indicated by the dotted box in FIG. 3. Specifically, FIG. 4A shows portions of the active device regions 14 and 18, portions of the gate structures 22 and 28, and their associated sidewall dielectric spacers 22S and 28S. FIG. 4B shows a cross-sectional view of the selected portion of the SRAM cell along the line II-II in FIG. 4A. Specifically, FIG. 4B shows a portion of the pass-gate transistor 4 with its source, drain, and channel regions (not shown) located in the active device region 14 and a gate structure comprising a gate dielectric layer 46, a gate conductor 28, and a dielectric sidewall spacer 28S. The pass-gate transistor 4 may further comprise metal silicide surface layers 42S, 44S, and 48S at its source, drain, and gate regions.

Figure 5B:
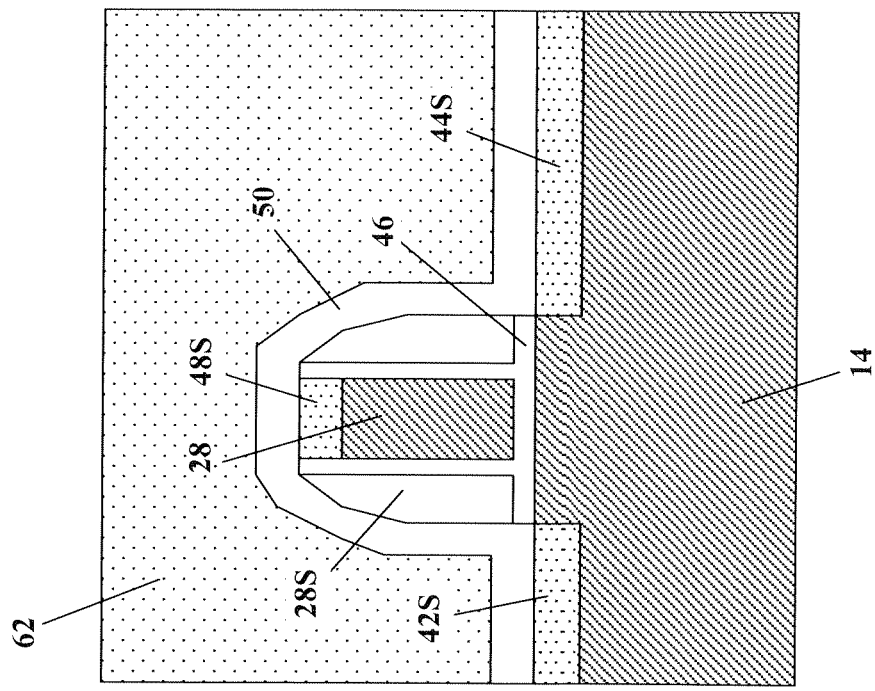
Figure 5A:
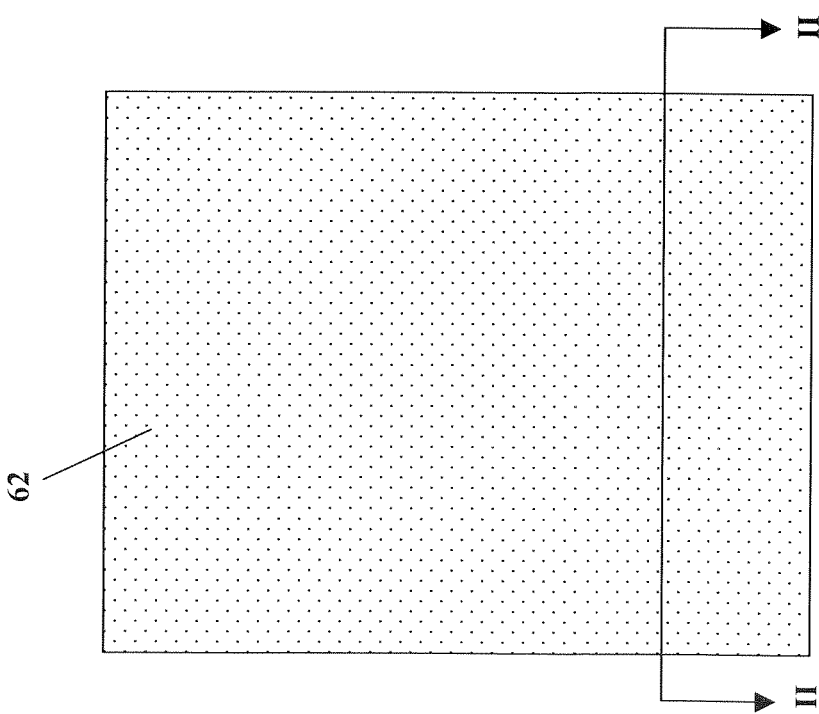

An interlevel dielectric (ILD) layer 62 is deposited over the entire SRAM cell structure to cover all the transistors thereof, including the pass-gate transistor 4, as shown in FIGS. 5A and 5B.

Figure 6B:
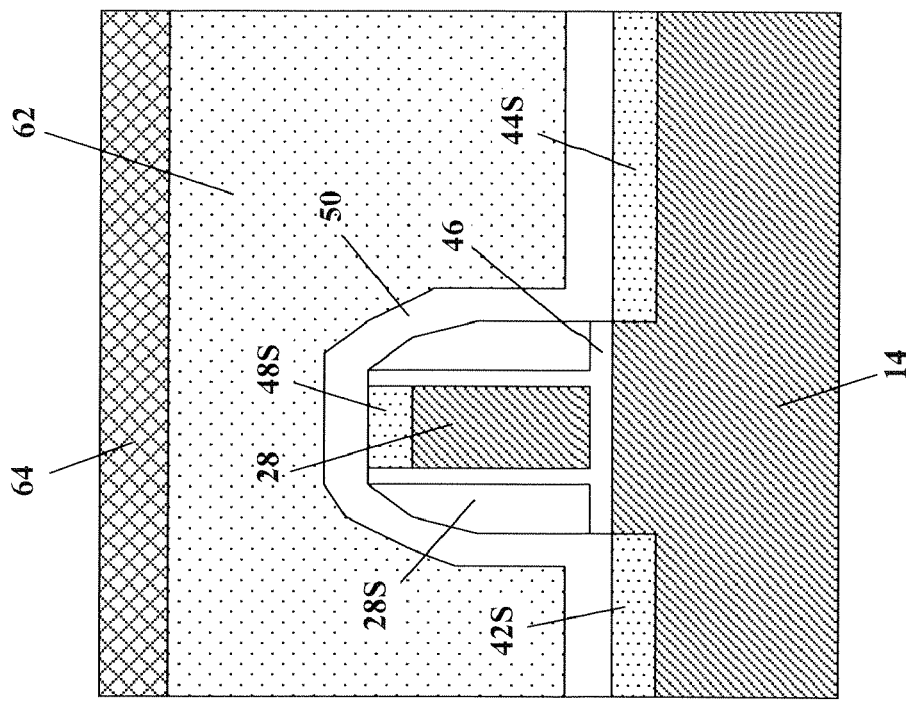
Figure 6A:
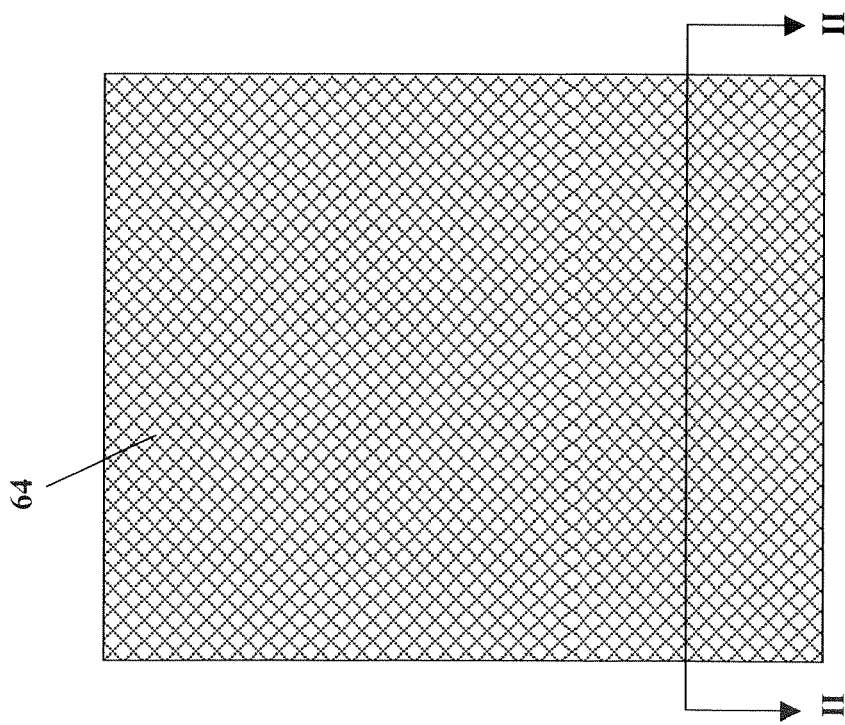

A dielectric hard mask layer 64 is then deposited over the ILD layer 62, as shown in FIGS. 6A-6B. Preferably, but not necessarily, the dielectric hard mask layer 64 comprises silicon nitride.

Figure 7B:
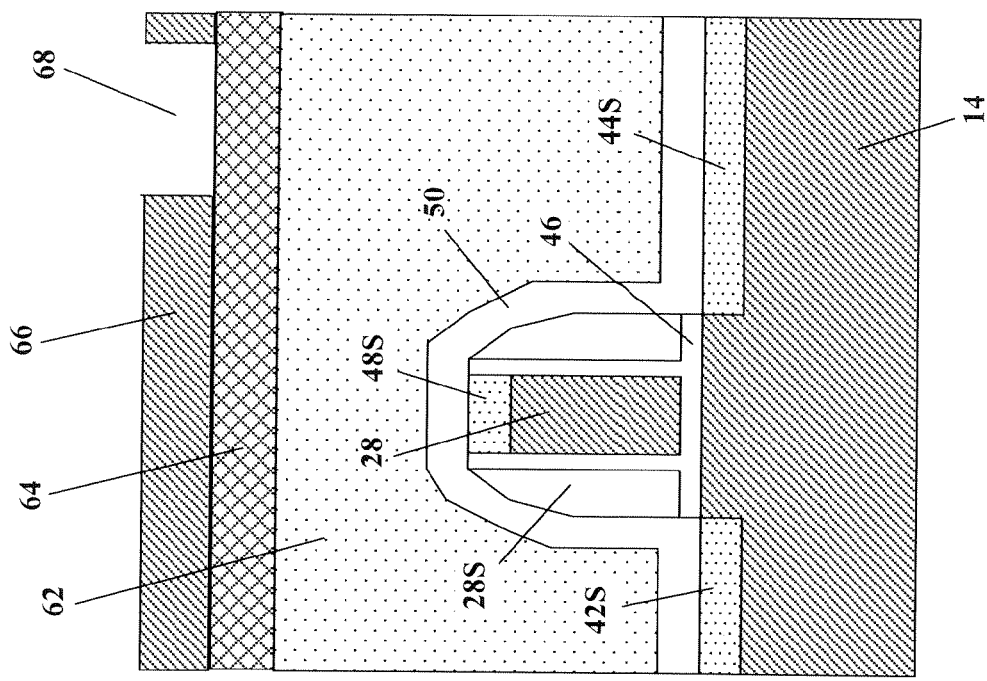
Figure 7A:
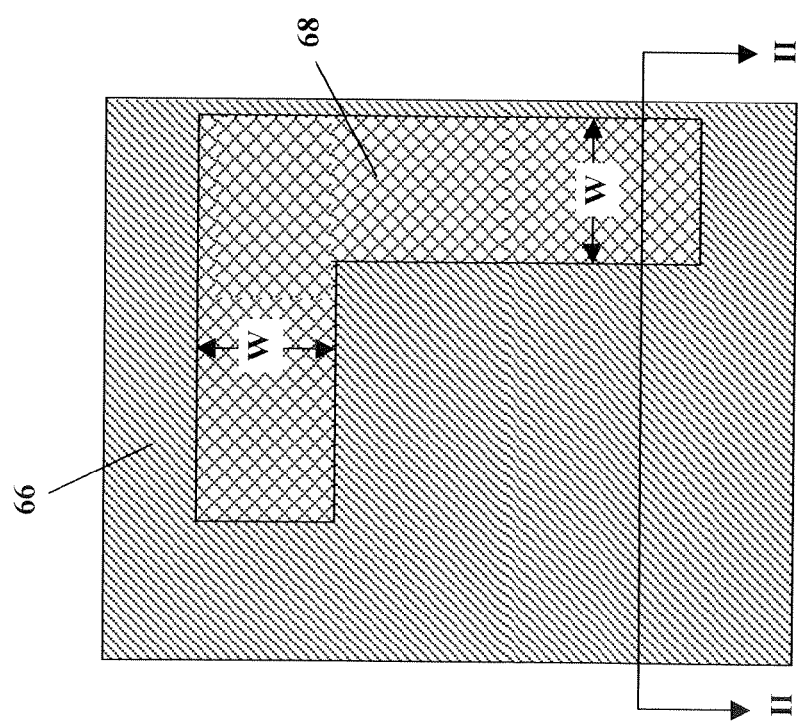
Figure 8B:
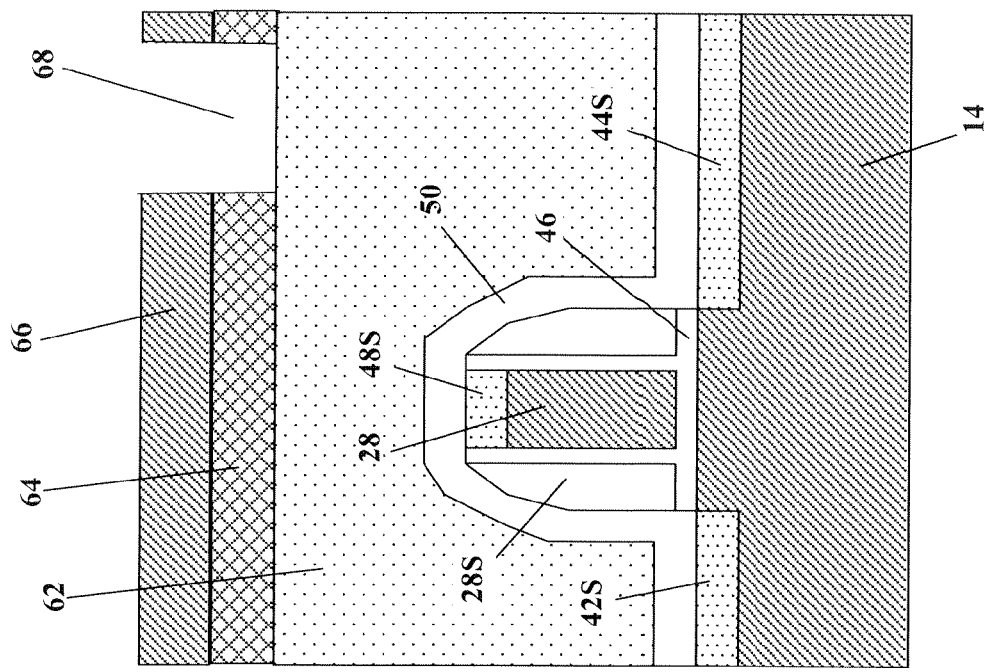
Figure 8A:
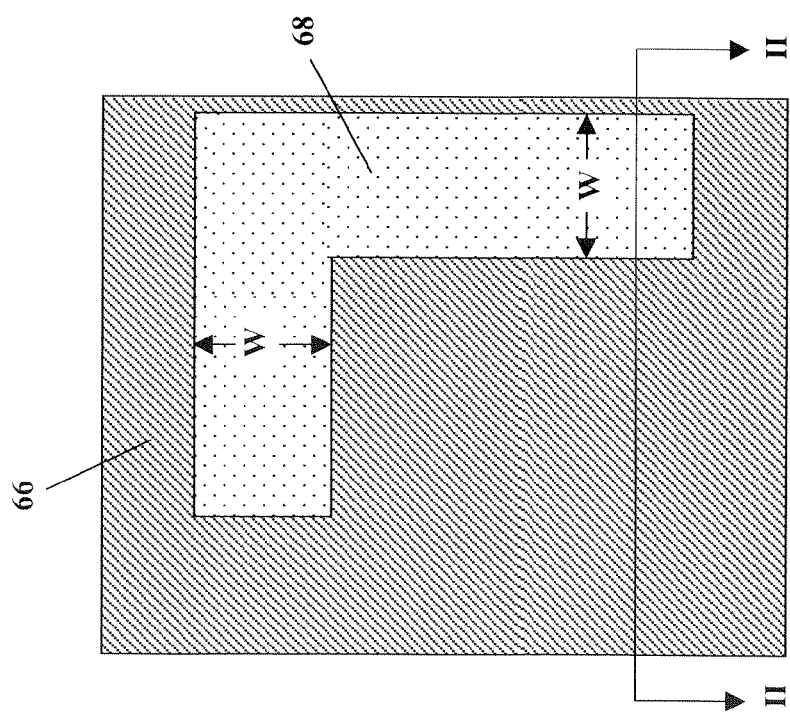

Next, a pattern photoresist layer 66 is formed over the dielectric hard mask layer 64 by using conventional lithography and photoresist development techniques to define a L-shaped lithographic mask opening 68 having a width (W), as shown in FIGS. 7A-7B. The L-shaped lithographic mask opening 68 in the patterned photoresist layer 66 can be extended through the dielectric hard mask layer 64 by conventional pattern transfer techniques, as shown in FIGS. 8A-8B. After pattern transfer, the photoresist layer 66 is removed by resist stripping to expose an upper surface of the underlying dielectric hard mask layer 64 with the L-shaped lithographic mask opening 68 therein.

The width (W) of the L-shaped lithographic mask opening 68 is limited by the minimum printing critical dimension (CD) of conventional lithography and cannot be further reduced using the conventional lithographic techniques alone. The present invention therefore employs a self-assembling block copolymer to form sub-lithographic features in the L-shaped lithographic mask opening.

It has been known that certain materials are capable of spontaneous organization of materials into ordered patterns without the need for human interference, which is typically referred to as the self-assembly of materials. Examples of material self-assembly range from snowflakes to seashells to sand dunes, all of which form some type of regular or ordered patterns in response to the external conditions.

Among various self-assembling materials, self-assembling block copolymers that are capable of self-organizing into nanometer-scale patterns are particularly promising for enabling future advances in the semiconductor technology. Each self-assembling block copolymer system typically contains two or more different polymeric block components that are immiscible with one another. Under suitable conditions, the two or more immiscible polymeric block components separate into two or more different phases on a nanometer scale and thereby form ordered patterns of isolated nano-sized structural units.

Such ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 10 to 40 nm, which are sub-lithographic (i.e., below the resolutions of the lithographic tools). Further, the self-assembling block copolymers are compatible with conventional semiconductor, optical, and magnetic processes. Therefore, the ordered patterns of nano-sized structural units formed by such block copolymers have been integrated into semiconductor, optical, and magnetic devices where a large, ordered array of repeating structural units are required.

However, the CMOS technology requires precise placement or registration of individual structural units for formation of metal lines and vias in the wiring levels. Therefore, the large, ordered array of repeating structural units formed by self-assembling block copolymers could not be used in CMOS devices, because of lack of alignment or registration of the position of individual structure unit.

The present invention provides a method that combines a conventional lithographic technology with the self-assembling block copolymer technology to form sub-lithographic features.

Specifically, a thin layer of a self-assembling block copolymer (having a thickness typically ranging from about 20 nm to about 100 nm) is first applied over the device structure shown in FIGS. 8A-8B and then annealed to form an ordered pattern containing repeating structural units inside the already formed L-shaped lithographic mask opening 68.

The width (W) of the L-shaped lithographic mask opening 68 is carefully adjusted so that only a single unit polymer block can be formed therein from the self-assembling block copolymer. The single unit polymer block is embedded in a polymeric matrix that is in turn located inside the L-shaped lithographic mask opening 68, and it has a width that is less than the diameter of the mask openings. The single unit polymer block can be selectively removed relative to the polymeric matrix, thereby leaving a single opening of the smaller width in the polymeric matrix inside the L-shaped lithographic mask opening 68. The single opening of the smaller width can then be used for sub-lithographic patterning of the device structure.

There are many different types of block copolymers that can be used for practicing the present invention. As long as a block copolymer contains two or more different polymeric block components that are not immiscible with one another, such two or more different polymeric block components are capable of separating into two or more different phases on a nanometer scale and thereby form patterns of isolated nano-sized structural units under suitable conditions.

In a preferred, but not necessary, embodiment of the present invention, the block copolymer consists essentially of first and second polymeric block components A and B that are immiscible with each other. The block copolymer may contain any numbers of the polymeric block components A and B arranged in any manner. The block copolymer can have either a linear or a branched structure. Preferably, such a block polymer is a linear diblock copolymer having the formula of A-B.

Specific examples of suitable block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The specific structural units formed by the block copolymer are determined by the molecular weight ratio between the first and second polymeric block components A and B. For example, when the ratio of the molecular weight of the first polymeric block component A over the molecular weight of the second polymeric block component B is greater than about 80:20, the block copolymer will form an ordered array of spheres composed of the second polymeric block component B in a matrix composed of the first polymeric block component A. When the ratio of the molecular weight of the first polymeric block component A over the molecular weight of the second polymeric block component B is less than about 80:20 but greater than about 60:40, the block copolymer will form an ordered array of cylinders composed of the second polymeric block component B in a matrix composed of the first polymeric block component A. When the ratio of the molecular weight of the first polymeric block component A over the molecular weight of the second polymeric block component B is less than about 60:40 but is greater than about 40:60, the block copolymer will form alternating lamellae composed of the first and second polymeric block components A and B. Therefore, the molecular weight ratio between the first and second polymeric block components A and B can be readily adjusted in the block copolymer of the present invention, in order to form desired structural units.

In a preferred embodiment of the present invention, the ratio of the molecular weight of the first polymeric block component A over the molecular weight of the second polymeric block component B ranges from about 60:40 to about 40:60, so that the block copolymer of the present invention will form alternating layers of the first polymeric block component A and the second polymeric block component B.

Preferably, one of the components A and B can be selectively removable relative to the other, thereby resulting in either orderly arranged structural units composed of the un-removed component. For example, when the second polymeric block component B is selectively removable relative to the first polymeric block component A, orderly arranged trenches can be formed.

In a particularly preferred embodiment of the present invention, the block copolymer used for forming the self-assembled periodic patterns of the present invention is PS-b-

PMMA with a PS:PMMA molecular weight ratio ranging from about 60:40 to about 40:60.

Typically, mutual repulsion between different polymeric block components in a block copolymer is characterized by the term $\chi N$, where $\chi$ is the Flory-Huggins interaction parameter and N is the degree of polymerization. The higher $\chi N$, the higher the repulsion between the different blocks in the block copolymer, and the more likely the phase separation therebetween. When $\chi N > 10$ (which is hereinafter referred to as the strong segregation limit), there is a strong tendency for the phase separation to occur between different blocks in the block copolymer.

For a PS-b-PMMA diblock copolymer, $\chi$ can be calculated as approximately $0.028+3.9/T$, where T is the absolute temperature. Therefore, $\chi$ is approximately 0.0362 at 473 K ($\approx 200°$ C.). When the molecular weight ($M_n$) of the PS-b-PMMA diblock copolymer is approximately 64 Kg/mol, with a molecular weight ratio (PS:PMMA) of approximately 66:34, the degree of polymerization N is about 622.9, so $\chi N$ is approximately 22.5 at 200° C.

In this manner, by adjusting one or more parameters such as the composition, the total molecular weight, and the annealing temperature, the mutual compulsion between the different polymeric block components in the block copolymer of the present invention can be readily controlled to effectuate desired phase separation between the different block components. The phase separation in turn leads to formation of self-assembled periodic patterns containing ordered arrays of repeating structural units (i.e., spheres, cylinders, or lamellae), as described hereinabove.

In order to form the self-assembled periodic patterns, the block copolymer is first dissolved in a suitable solvent system to form a block copolymer solution, which is then applied onto a surface to form a thin block copolymer layer, followed by annealing of the thin block copolymer layer, thereby effectuating phase separation between different polymeric block components contained in the block copolymer.

The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. The block copolymer solution preferably contains the block copolymer at a concentration ranging from about 0.1% to about 2% by total weight of the solution. More preferably, the block copolymer solution contains the block copolymer at a concentration ranging from about 0.5 wt % to about 1.5 wt %. In a particularly preferred embodiment of the present invention, the block copolymer solution comprises about 0.5 wt % to about 1.5 wt % PS-b-PMMA dissolved in toluene or PGMEA.

The block copolymer solution can be applied to the surface of a device structure by any suitable techniques, including, but not limited to: spin casting, coating, spraying, ink coating, dip coating, etc. Preferably, the block copolymer solution is spin cast onto the surface of a device structure to form a thin block copolymer layer thereon.

After application of the thin block copolymer layer onto the device surface, the entire device structure is annealed to effectuate micro-phase segregation of the different block components contained by the block copolymer, thereby forming the periodic patterns with repeating structural units. Annealing of the block copolymer in the present invention can be achieved by various methods known in the art, including, but not limited to: thermal annealing (either in a vacuum or in an inert atmosphere containing nitrogen or argon), ultra-violet annealing, laser annealing, solvent vapor-assisted annealing (either at or above room temperature), and supercritical fluid-assisted annealing, which are not described in detail here in order to avoid obscuring the invention.

In a particularly preferred embodiment of the present invention, a thermal annealing step is carried out to anneal the block copolymer layer at an elevated annealing temperature that is above the glass transition temperature ($T_g$) of the block copolymer, but below the decomposition or degradation temperature ($T_d$) of the block copolymer. More preferably, the thermal annealing step is carried out an annealing temperature of about 200° C.-300° C. The thermal annealing may last from less than about 1 hour to about 100 hours, and more typically from about 1 hour to about 15 hours. In an alternative embodiment of the present invention, the block copolymer layer is annealed by ultra-violet (UV) treatment.

Figures 9A, 9B:
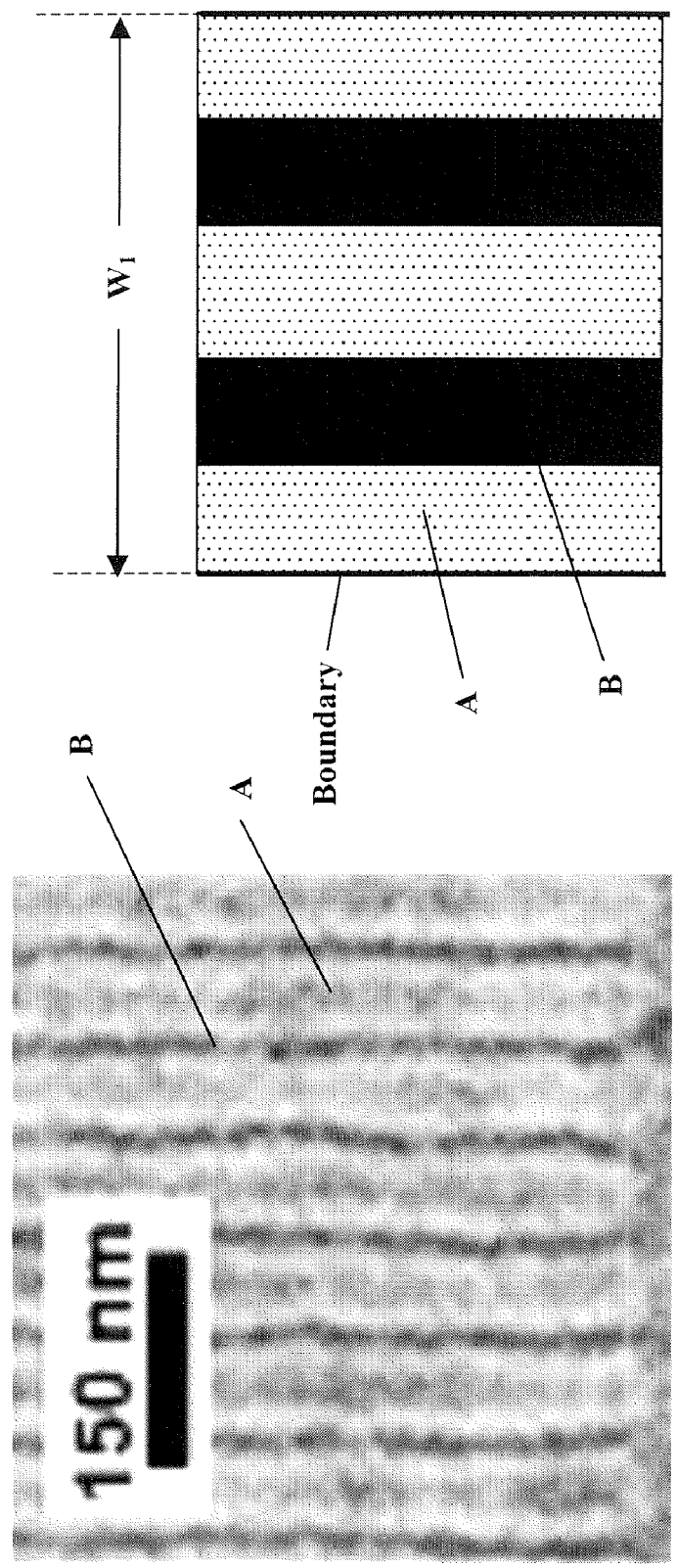

FIG. 9A shows a top-down scanning electron microscopic (SEM) photograph of an ordered pattern or array of repeating structure units that are formed over a substantially planar surface from a block copolymer thin film. The repeating structural units B comprise alternating layers of first and second block copolymer components A and B that are located in a trench and stand perpendicularly to the bottom surface of the trench.

The present invention employs lithographic features to limit formation and placement of the structural units formed by the self-assembling block copolymer materials. More specifically, the lithographic features as used by the present invention have dimensions that are adjusted so that only a single unit polymer block can be formed and placed inside each lithographic feature from the self-assembling block copolymer.

Figure 9D:
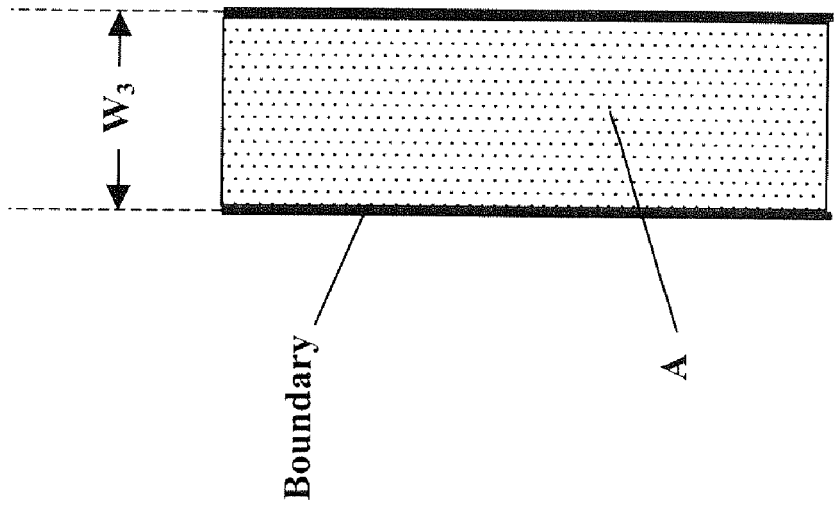
Figure 9C:
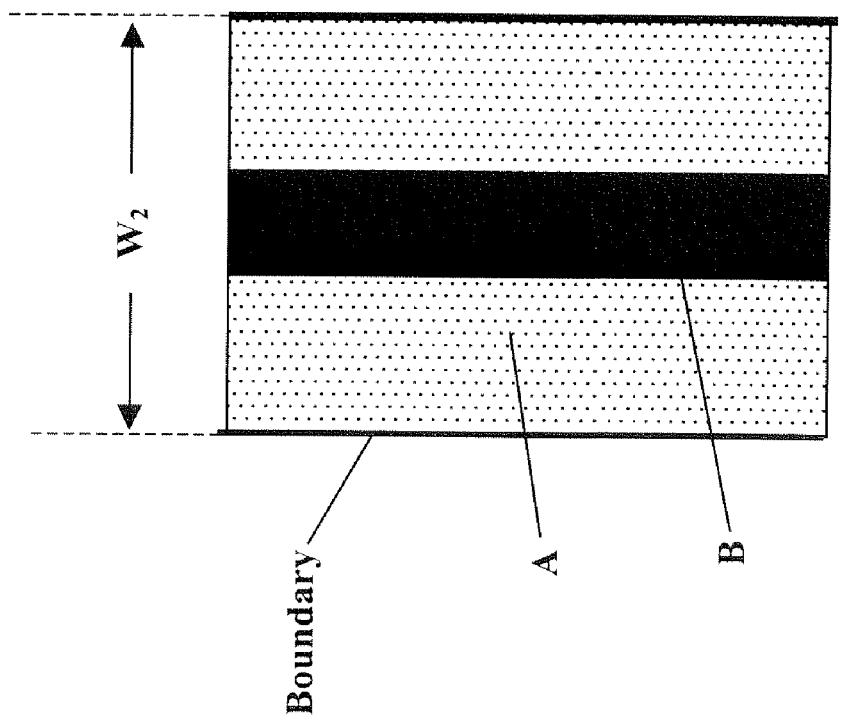

In order to achieve formation and placement of such a single structure unit, the lithographic feature employed in the present invention should have a suitable dimension. For a PS-b-PMMA block copolymer having a molecular weight ($M_n$) of about 64 Kg/mol and a PS:PMMA molecular weight ratio of about 50:50, lithographic openings having a width ($W_1$) greater than about 120 nm will form two or more repeating structure units in each lithographic opening, as shown in FIG. 9B; lithographic openings having a width ($W_2$) that ranges from about 20 nm to about 120 nm (more preferably from about 60 nm to about 100 nm) will form a single structure unit in each lithographic opening, as shown in FIG. 9C; and no structure unit will be formed in lithographic openings having a width ($W_3$) that is less than about 20 nm, as shown in FIG. 9D.

Therefore, by providing a L-shaped lithographic mask opening 68 with a width (W) ranging from about 20 nm to about 120 nm, and more preferably from about 60 nm to about 100 nm, the present invention allows formation of a single sub-lithographic structure unit in the L-shaped lithographic mask opening 68.

Optionally, but not necessarily, the interior surfaces of the L-shaped lithographic mask opening 68 are treated before application of a block copolymer layer. Specifically, one or more surface layers are formed over the bottom surface and sidewall surfaces of the L-shaped lithographic mask opening 68, so as to provide the desired wetting properties for aligning the alternating layers of unit polymeric blocks to be formed with the L-shaped lithographic mask opening 68.

The wetting properties as discussed herein refer to the surface affinities of a specific surface with respect to the different block components of the block copolymers. For example, if a surface has substantially the same surface affinity to both block components A and B of a block copolymer, such a surface is considered a neutral surface or a non-preferential surface, i.e., both block components A and B can wet or have affinities to such a surface. In contrast, if a surface has significantly different surface affinities for the block components A and B, such a surface is then considered a preferential surface, i.e., only one of block components A and B can wet such a surface, but the other cannot.

Surfaces comprising one of silicon native oxides, silicon oxides, and silicon nitrides are preferentially wetted by PMMA block components, but not by PS block components. Therefore, such surfaces can be used as preferential surfaces for PS-b-PMMA block copolymers. On the other hand, a monolayer comprising a substantially homogenous mixture of PS and PMMA components, such as a random PS-r-PMMA copolymer layer, provides a neutral surface or a non-preferential surface for PS-b-PMMA block copolymers.

In order to form alternating layers of polymeric blocks that are aligned perpendicular to the bottom surface of the L-shaped lithographic mask opening 68 from PS-b-PMMA, it is desired to deposit a neutral or non-preferential monolayer (e.g., a substantially homogenous mixture of PS and PMMA components) over the bottom surface of the L-shaped lithographic mask opening 68, while the sidewall surfaces of the L-shaped lithographic mask opening 68, which preferably comprise silicon nitrides or oxides, are either left untreated or are coated with a preferential wetting material (e.g., silicon native oxides, silicon oxides, and silicon nitrides). In this manner, the alternating layers of polymeric blocks formed from PS-b-PMMA will stand perpendicular to the bottom surface of the L-shaped lithographic mask opening 68.

Figure 10B:
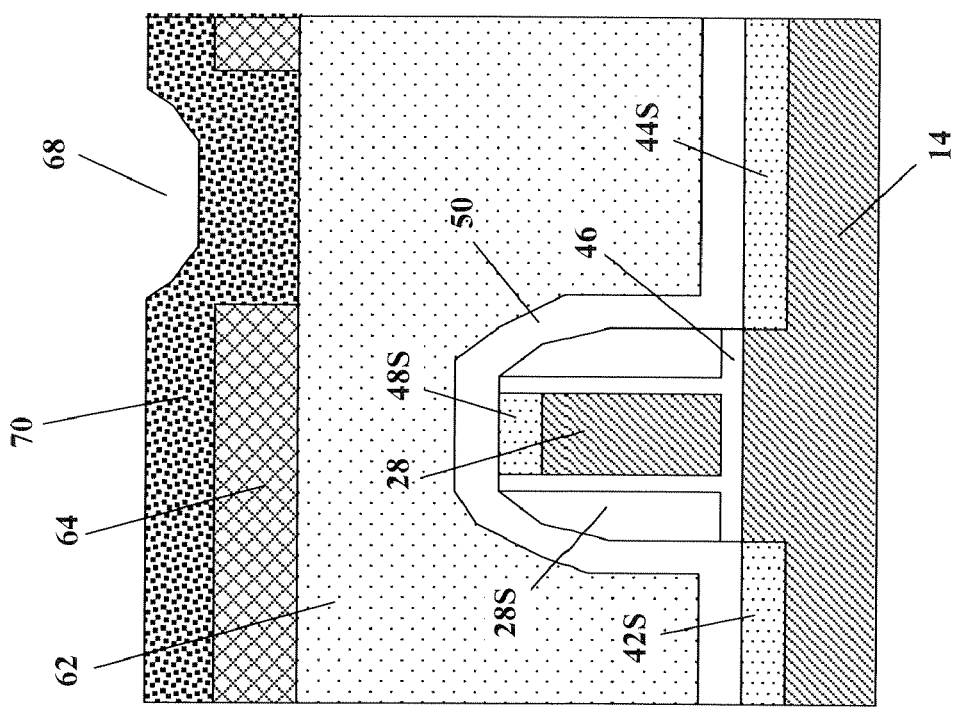
Figure 10A:
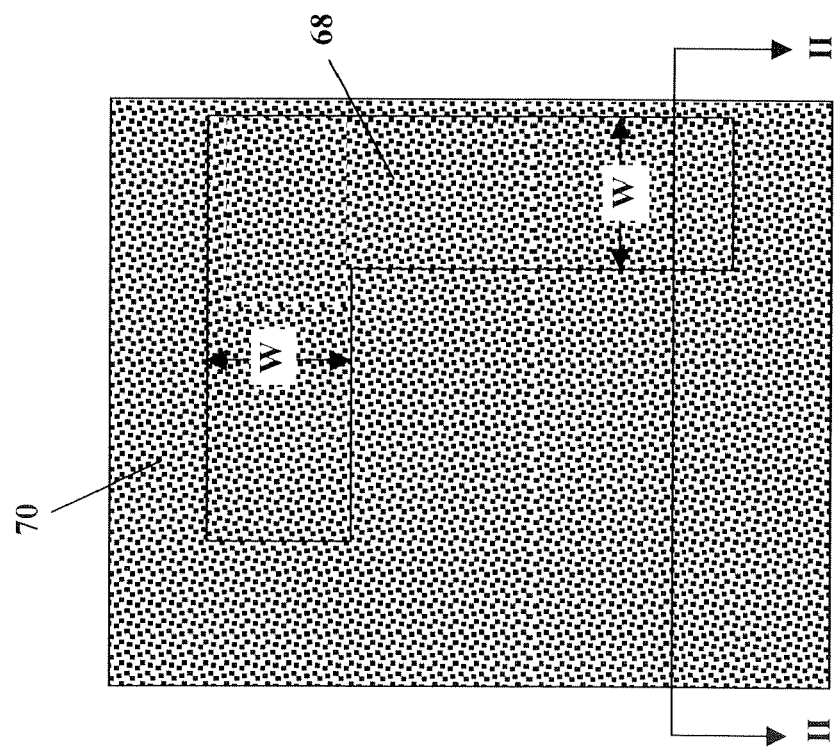

Next, a thin layer of a self-assembling block copolymer 70 is applied over the entire structure, including the L-shaped lithographic mask opening 68, as shown in FIGS. 10A and 10B.

Figure 11B:
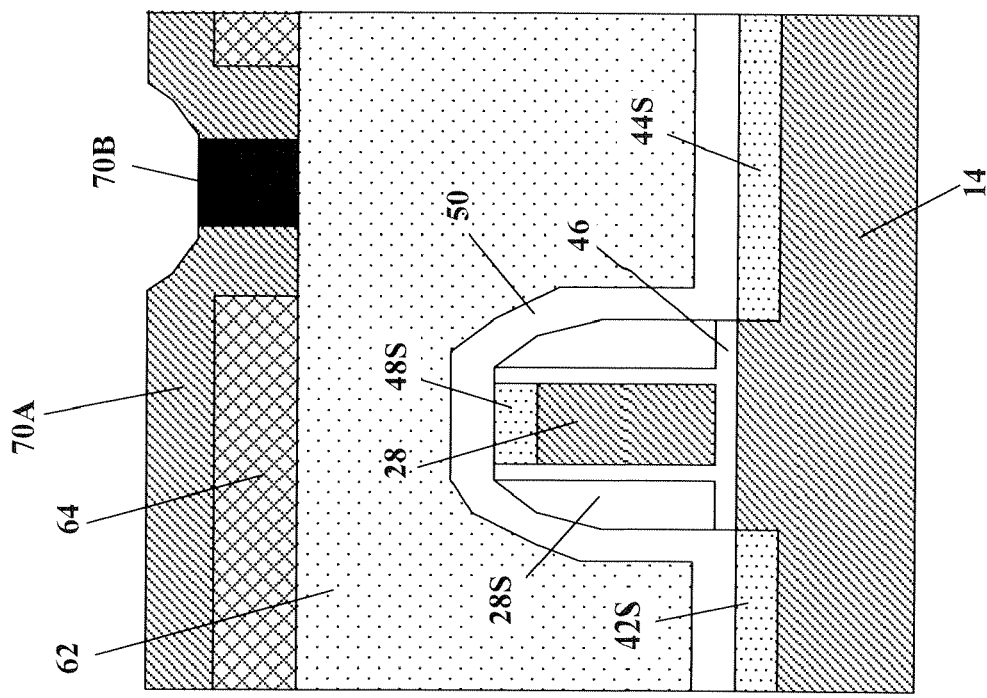
Figure 11A:
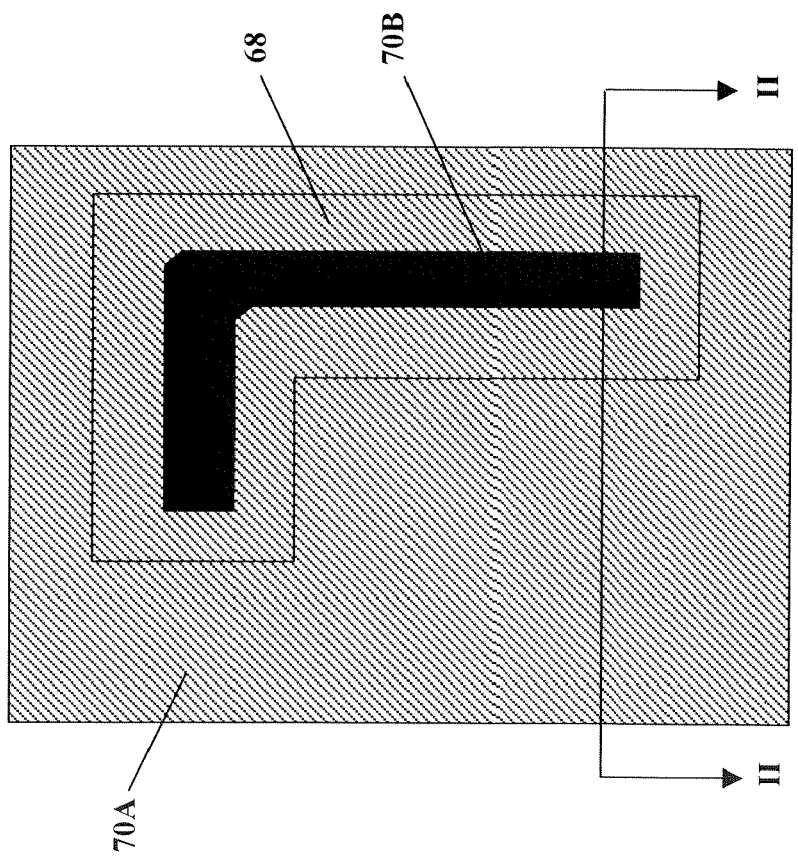

Preferably, but not necessarily, the self-assembling block copolymer 70 comprises PS-b-PMMA with a PS:PMMA molecular weight ratio of about 50:50 and a total molecular weight of about 64 Kg/mol. Such a PS-b-PMMA block copolymer, when placed and annealed on a substantially planar surface, is capable of forming highly uniform alternating PS and PMMA layers. Each PMMA layer has a thickness of about 20 nm, and the spacing between neighboring PMMA layers is about 40 nm. However, because of the presence of the L-shaped lithographic mask opening 68 of the width W, annealing of the self-assembling block copolymer 70 forms only a single PMMA layer 70B that is embedded in a PS matrix 70A inside the L-shaped lithographic mask opening 68, as shown in FIGS. 11A and 11B. The single PMMA layer 70B has a thickness ranging from about 20 nm to about 40 nm, which is significantly smaller than the width (W) of the L-shaped lithographic mask opening 68 and is therefore sub-lithographic.

Figure 12B:
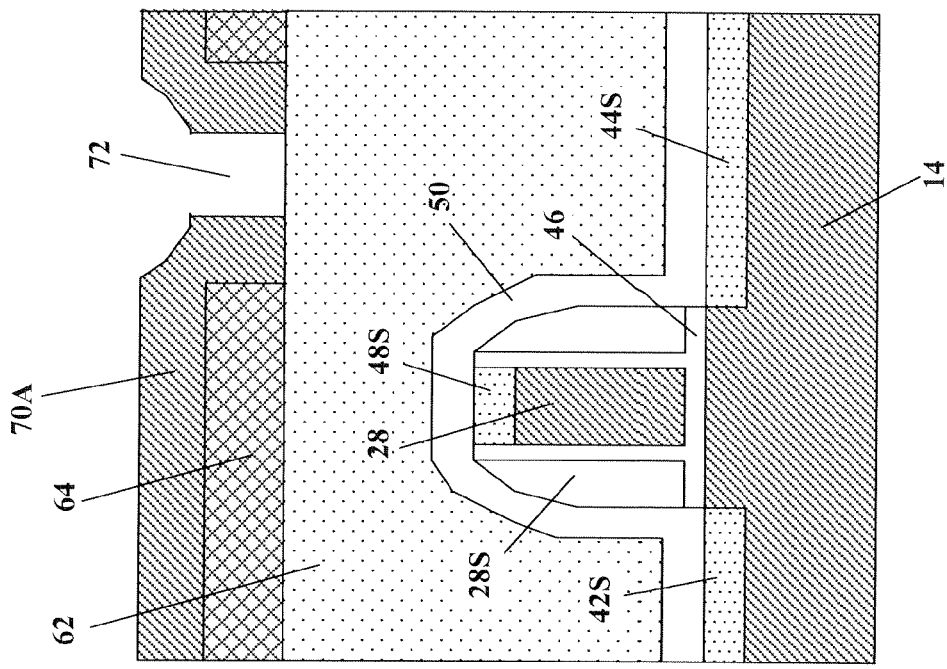
Figure 12A:
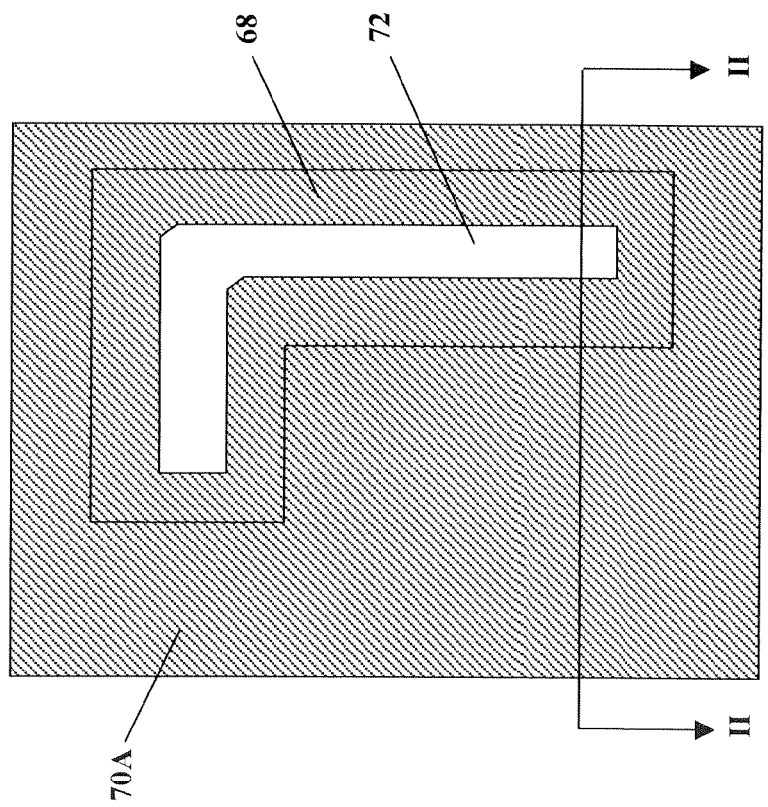

Next, the entire structure as shown in FIGS. 11A and 11B is immersed in an acetic acid solution containing about 30% of acetic acid for a duration of about 2 minutes. The single PMMA layer 70B is selectively removed by the acetic acid solution, thereby leaving a single L-shaped sub-lithographic opening 72 in the PS matrix 70A inside the L-shaped lithographic mask opening 68, as shown in FIGS. 12A and 12B.

Figure 13B:
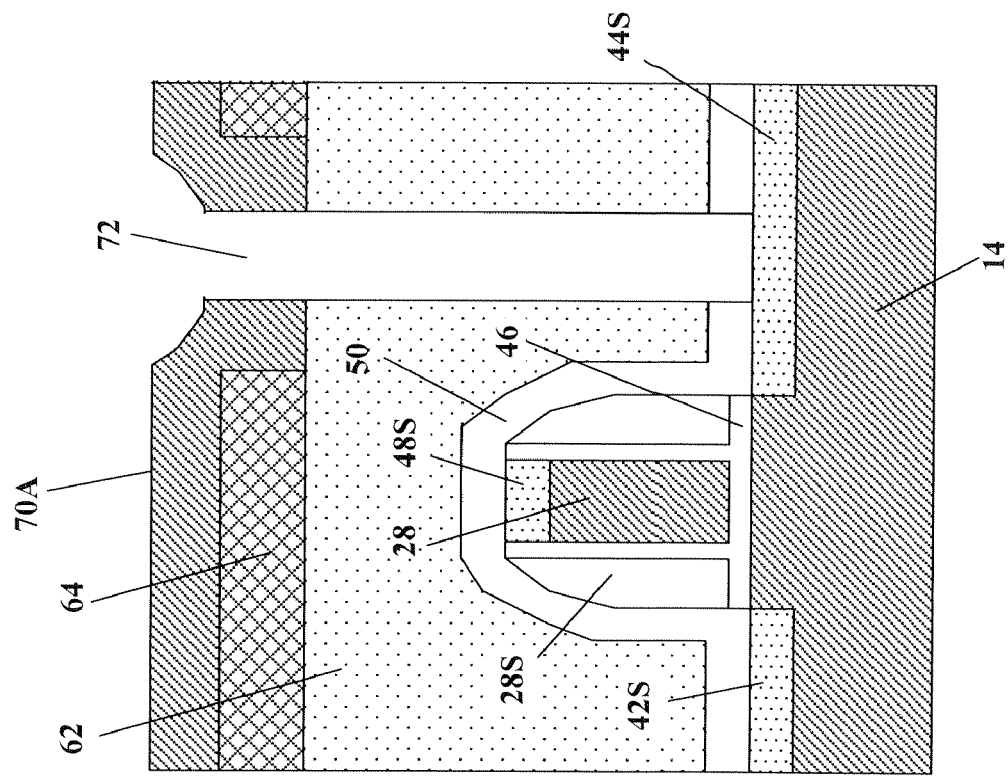
Figure 13A:
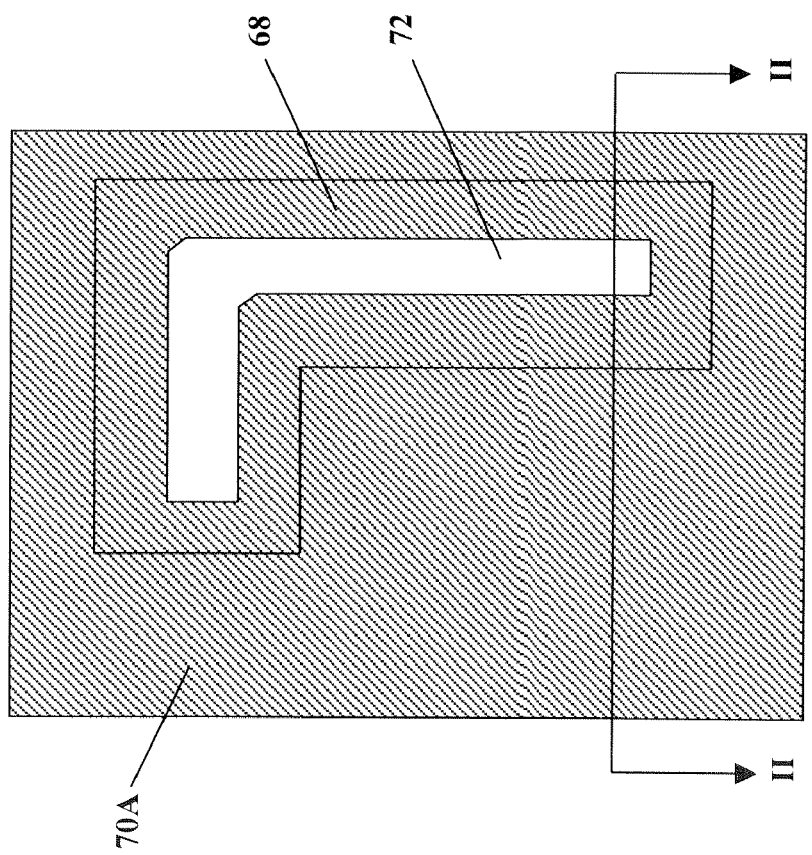

The single L-shaped sub-lithographic opening 72 has the sub-lithographic width or thickness ranging from about 20 nm to about 40 nm and can subsequently be used to pattern the ILD layer 62. Specifically, the L-shaped sub-lithographic opening 72 is extended through the ILD layer 26 onto the source or drain metal silicide layer 44S of the pass-gate transistor 4 by one or more dry and/or wet etching steps, where the polymeric matrix 70A is used as an etching mask, as shown in FIGS. 13A and 13B.

Figure 14B:
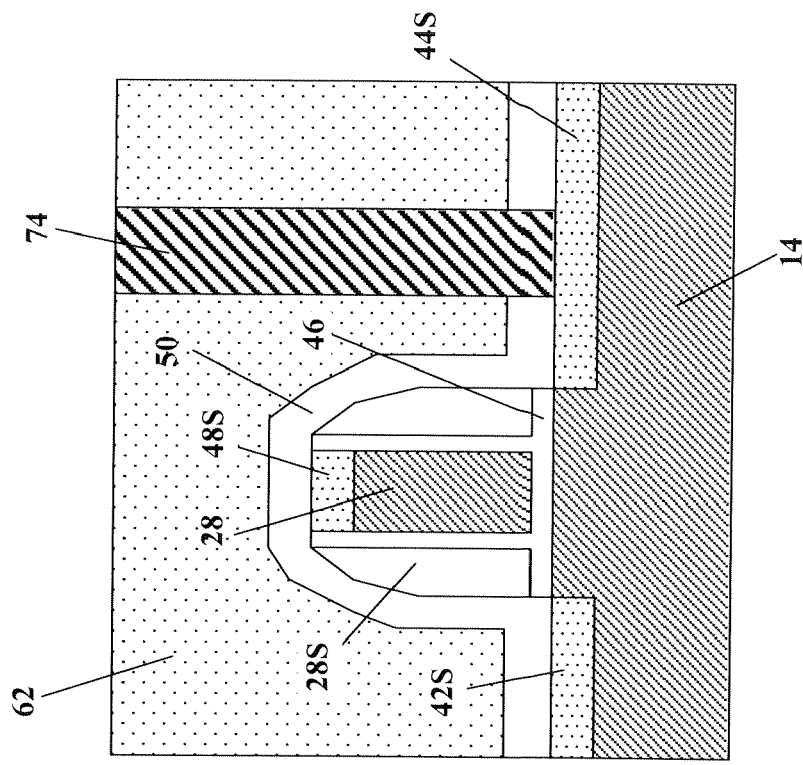
Figure 14A:
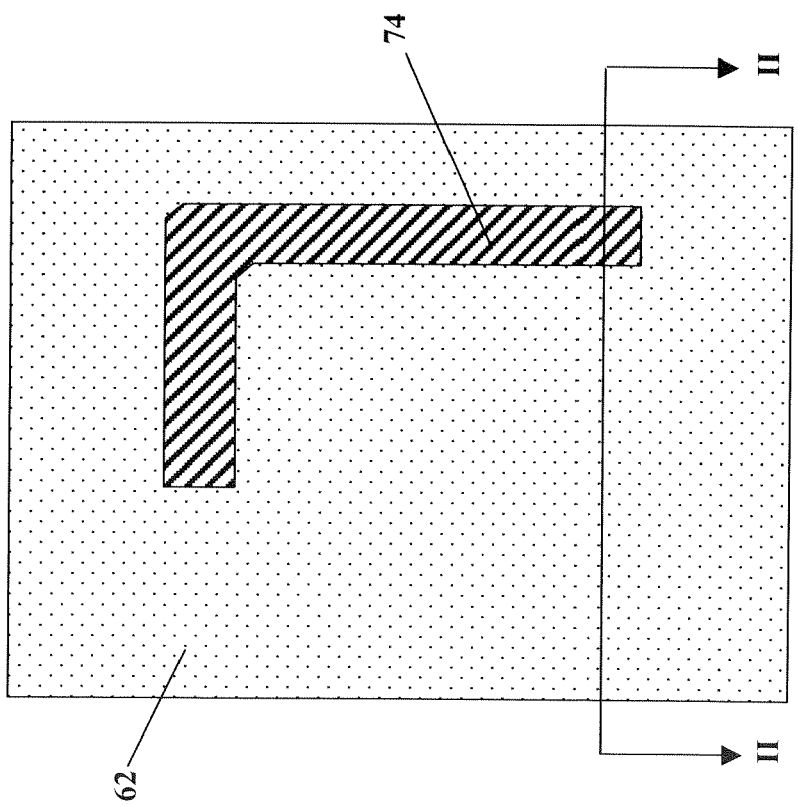

The L-shaped sub-lithographic opening 72 can subsequently be filled with a conductive material, followed by planarization steps to form a L-shaped sub-lithographic interconnect 74, as shown in FIGS. 14A-14B. Any suitable conductive material, such as, for example, doped semiconductors, metals, metal alloys, metal silicides, metal nitrides, etc., can be used to form the L-shaped sub-lithographic interconnect 74. Conventional chemical mechanical polishing (CMP) techniques can be used for planarizing the deposited conductive material.

Figure 16B:
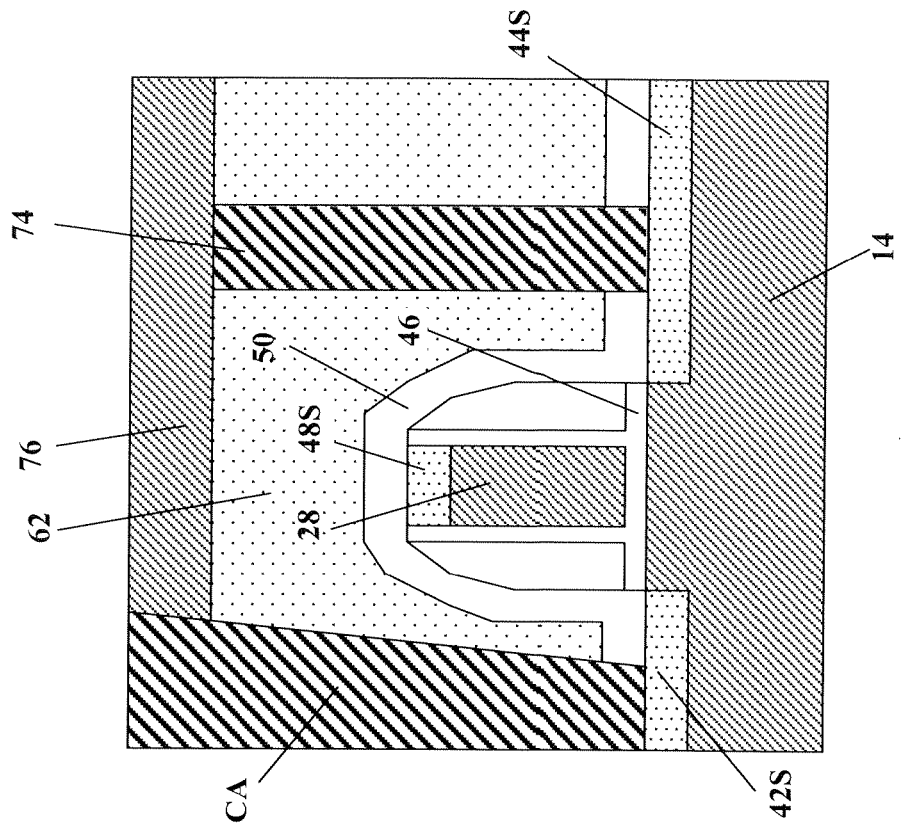
Figure 16A:
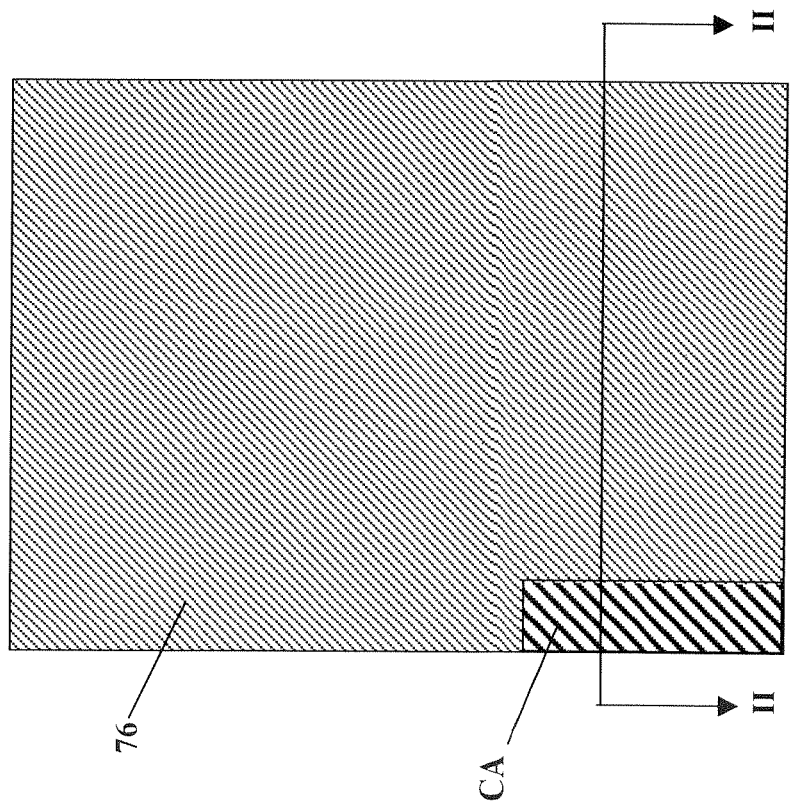

Next, a second ILD layer 76 can be deposited over the entire structure, as shown in FIGS. 15A-15B, followed by formation of a peripheral metal contact (CA), as shown in FIGS. 16A and 16B. A third ILD layer 78 can be deposited over the second ILD layer 76 to define the first metal level M1, and an external node (EN) can be formed in M1 to contact CA, as shown in FIGS. 17A-17B. The CA are connected to additional metal vias and/or metal interconnects in upper via or metal levels above M1, while the L-shaped sub-lithographic interconnect 74 is located underneath M1 and does not extend further up. Therefore, the L-shaped sub-lithographic interconnect 74 is a local interconnect.

The L-shaped sub-lithographic interconnect 74 can also be formed by using a L-shaped lithographic mask opening with a dielectric sidewall spacer, as illustrated in FIGS. 18A-20B.

Figure 18B:
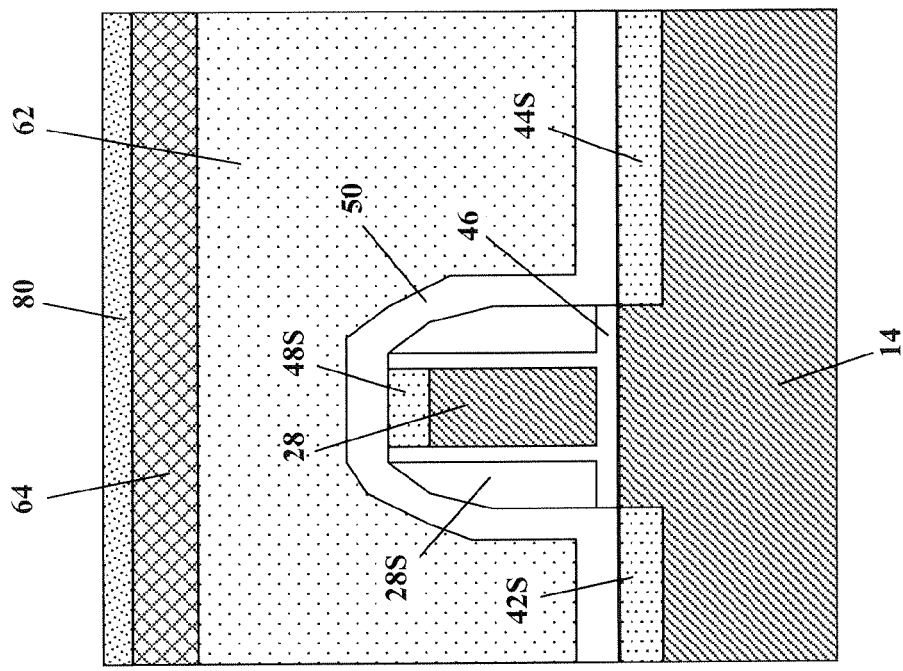
FIGS. 18A-20B are top or cross-sectional views that illustrate exemplary processing steps for forming an improved SRAM cell with L-shaped sub-lithographic local interconnects using dielectric sidewall spacers, according to one embodiment of the present invention.
Figure 18A:
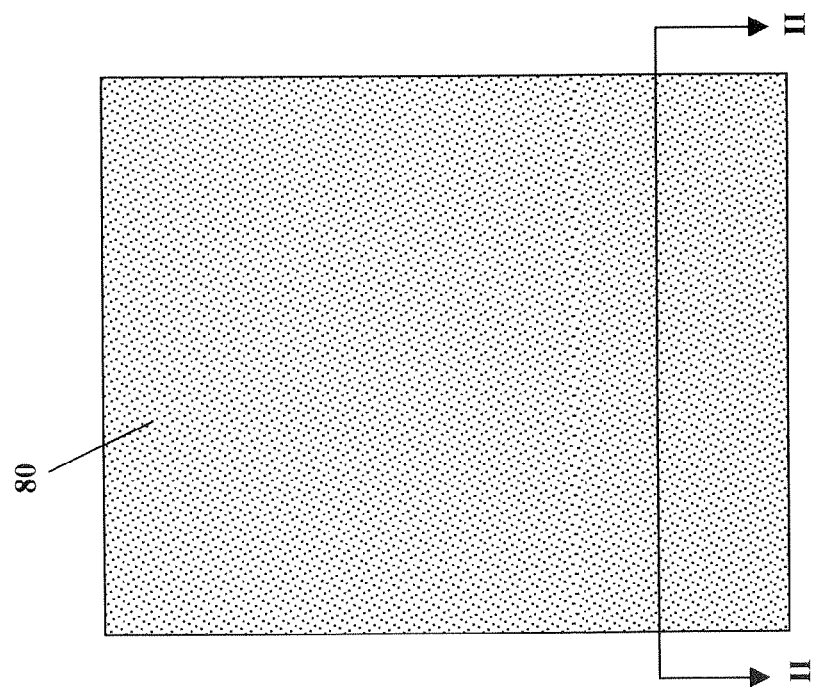
Figure 19B:
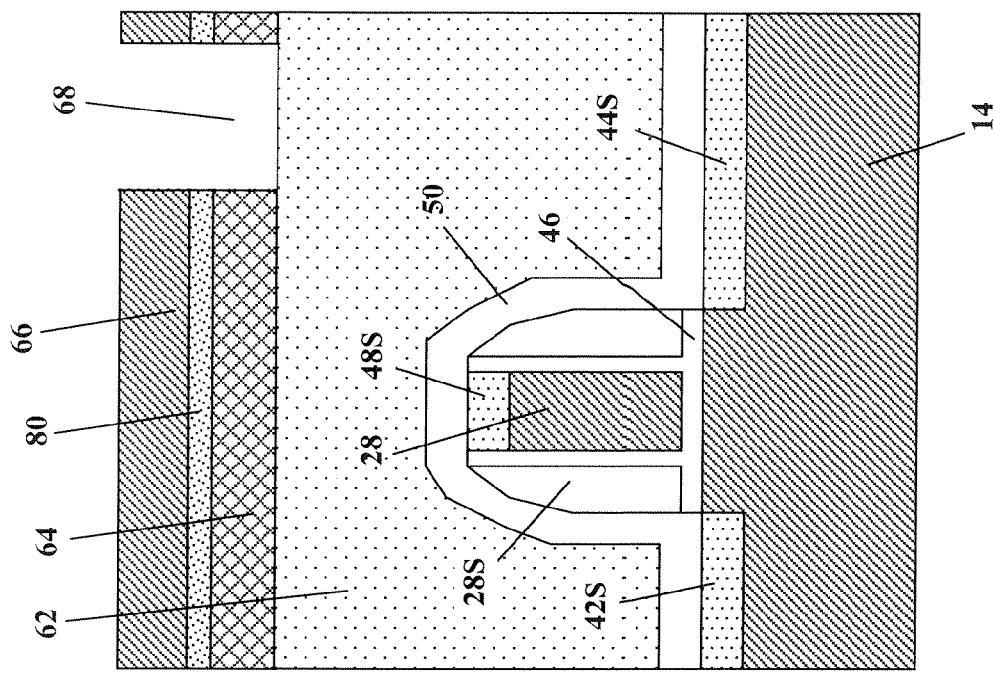
Figure 19A:
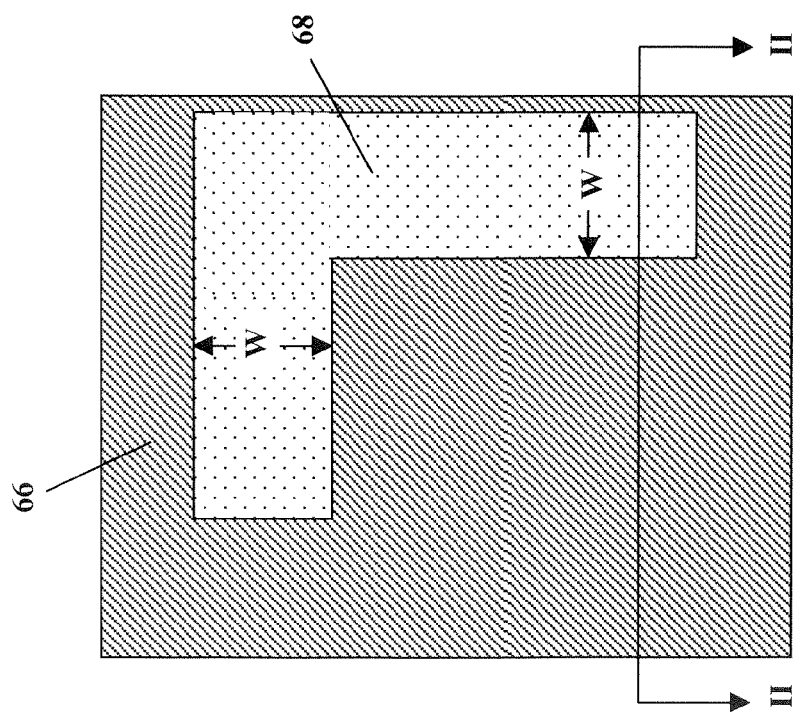
Figure 20B:
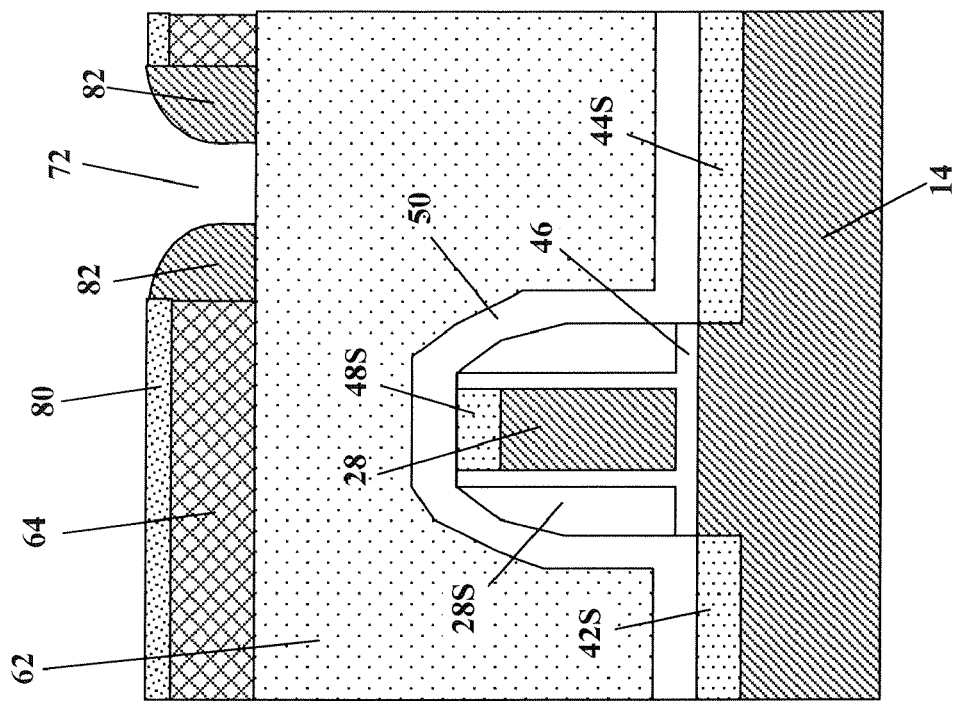
Figure 20A:
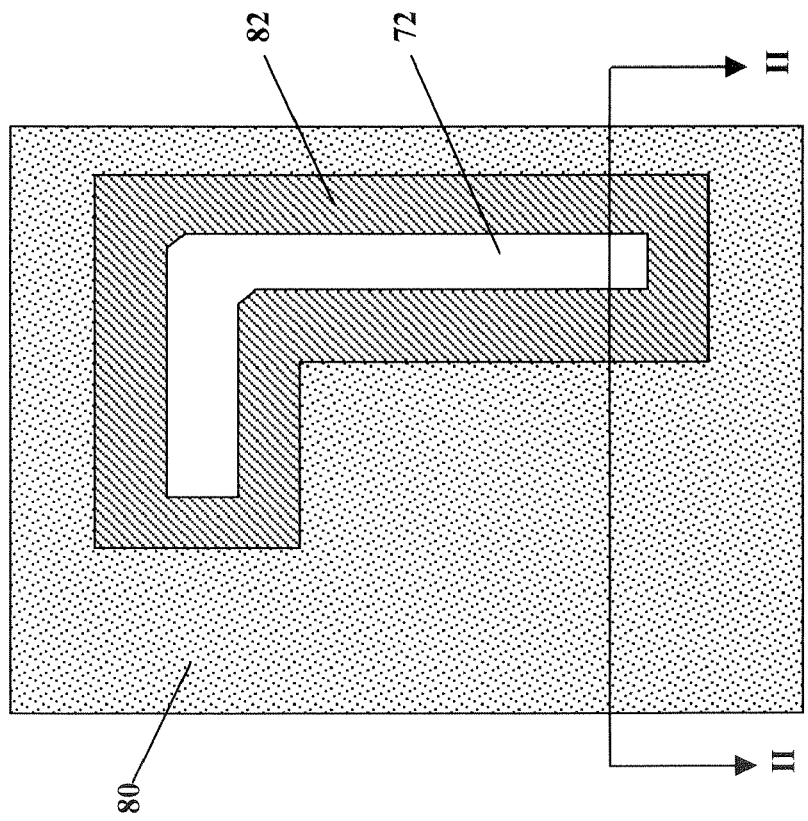

Specifically, a thin oxide layer 80 is deposited directly over the dielectric hard mask layer 64, as shown in FIGS. 18A-18B. Next, the pattered photoresist layer 66 is deposited over the thin oxide layer 80. The patterned photoresist layer 66 contains a L-shaped lithographic mask opening 68, which can be extended through the thin oxide layer 80 and the dielectric hard mask layer 64 by one or more dry- and/or wet-etching steps, as shown in FIGS. 19A-19B. Next, the patterned photoresist layer 66 is removed by resist stripping to expose an upper surface of the thin oxide layer 80, followed by formation of a dielectric sidewall spacer 82 along sidewalls of the L-shaped lithographic mask opening 68 to define a L-shaped sub-lithographic opening 72, as shown in FIGS. 20A-20B. The dielectric sidewall spacer 82 preferably comprises silicon nitride, and it can be readily formed by conventional nitride deposition followed by selective etching of the nitride over oxide.

The L-shaped sub-lithographic opening as defined by the dielectric sidewall spacer 82 can then be used for patterning the underlying ILD layer 62 and forming the L-shaped sub-lithographic interconnect 74, consistent with the description hereinabove.

Additional CMOS and back-end-of-line (BEOL) processing steps well known in the art can be further conducted to form a complete 6T-SRAM cell.

Because the L-shaped sub-lithographic interconnects as described hereinabove provide direct cross-connection between the pull-down and pull-up transistors located at different active device regions, only eight peripheral metal contacts (CAs) are needed for the SRAM cell at the contact level. Further, only eight external interconnect or nodes (ENs) are needed for the SRAM cell at the M1 level.

Although the above description is provided primarily in terms of SRAM cell structures, for simplicity and illustration purposes only, the present invention is not limited to SRAM cells, but is broadly applicable to other semiconductor device structures that require cross-connections between adjacent active device regions, with or without modifications and variations, as readily determinable by a person ordinarily skilled in the art according to the principles described herein.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method for forming a semiconductor device, comprising:
    forming first and second active device regions in a semiconductor substrate, wherein said first and second active device regions are isolated from each other by an isolation region therebetween, said first active device region including a first pull-down transistor of a SRAM cell and said second active device region including a first pull-up transistor of said SRAM cell; and
    forming a first sub-lithographic interconnect structure that has a width ranging from about 20 nm to about 40 nm for cross connecting the first pull-down transistor to said second pull-up transistor, said forming the first sub-lithographic interconnect structure including:
    forming an inter-level dielectric (ILD) layer over the first and second active device regions;
    forming a lithographically patterned mask layer over the ILD layer, wherein said lithographically patterned mask layer defines a first lithographic mask opening having a width ranging from about 60 nm to about 100 nm;
    applying a layer of a block copolymer comprising polystyrene-block-polymethylmethacrylate (PS-b-PMMA) having a PS:PMMA weight ratio from about 60:40 to about 40:60 over the lithographically patterned mask layer, wherein said block copolymer comprises at least first and second polymeric block components that are immiscible with each other;
    annealing the block copolymer layer to form a single unit polymer block having a sub-lithographic width ranging from about 20 nm to about 40 nm inside the first lithographic mask opening, wherein the single unit polymer block comprises the second polymeric block component and is embedded in a polymeric matrix that comprises the first polymeric block component;
    selectively removing the second polymeric block component relative to the first polymeric block component to form a first sub-lithographic opening having a width ranging from about 20 nm to about 120 nm in the polymeric matrix inside the first lithographic mask opening; and
    patterning the ILD layer using the first sub-lithographic opening and filling the first sub-lithographic opening with a conductive material.

* * * * *